(12) United States Patent
Wang et al.

(10) Patent No.: US 11,195,752 B1
(45) Date of Patent: Dec. 7, 2021

(54) SEMICONDUCTOR DEVICE AND METHOD OF FORMING SAME

(71) Applicant: Taiwan Semiconductor Manufacturing Co. Ltd., Hsinchu (TW)

(72) Inventors: Yu Shih Wang, Tainan (TW); Kuo-Bin Huang, Jhubei (TW); Ming-Hsi Yeh, Hsinchu (TW); Po-Nan Yeh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/887,316

(22) Filed: May 29, 2020

(51) Int. Cl.
| | |
|---|---|
| *H01L 21/768* | (2006.01) |
| *H01L 21/8238* | (2006.01) |
| *H01L 21/3213* | (2006.01) |
| *H01L 23/535* | (2006.01) |
| *H01L 29/66* | (2006.01) |
| *H01L 21/28* | (2006.01) |
| *H01L 27/092* | (2006.01) |
| *H01L 29/08* | (2006.01) |
| *H01L 29/49* | (2006.01) |

(52) U.S. Cl.
CPC .. *H01L 21/76895* (2013.01); *H01L 21/28088* (2013.01); *H01L 21/32134* (2013.01); *H01L 21/7684* (2013.01); *H01L 21/76804* (2013.01); *H01L 21/76805* (2013.01); *H01L 21/823814* (2013.01); *H01L 21/823821* (2013.01); *H01L 21/823842* (2013.01); *H01L 21/823871* (2013.01); *H01L 23/535* (2013.01); *H01L 27/0924* (2013.01); *H01L 29/0847* (2013.01); *H01L 29/4966* (2013.01); *H01L 29/66545* (2013.01)

(58) Field of Classification Search
CPC ......... H01L 21/76805; H01L 21/76834; H01L 21/76895; H01L 21/7684; H01L 21/76802; H01L 21/76826; H01L 21/76829; H01L 21/76832; H01L 21/76835; H01L 21/76838; H01L 21/76843; H01L 21/32134; H01L 21/823821; H01L 21/823871; H01L 21/76804; H01L 21/28088
See application file for complete search history.

(56) References Cited

U.S. PATENT DOCUMENTS

| | | | |
|---|---|---|---|
| 7,622,391 B2 | 11/2009 | Frohberg et al. | |
| 9,105,490 B2 | 8/2015 | Wang et al. | |

(Continued)

FOREIGN PATENT DOCUMENTS

| | | |
|---|---|---|
| DE | 102006035645 A1 | 2/2008 |
| DE | 102018125000 A1 | 5/2019 |

*Primary Examiner* — Thanhha S Pham
(74) *Attorney, Agent, or Firm* — Slater Matsil, LLP

(57) ABSTRACT

A method for forming a semiconductor device includes forming a metal contact on a substrate, forming a first dielectric on the metal contact, forming a first opening in the first dielectric, and performing a wet etch on a bottom surface of the first opening through a first etch stop layer (ESL) over the metal contact. The wet etch forms a first recess in a top surface of the metal contact. An upper width of the first recess is smaller than a lower width of the first recess. A first conductive feature is formed in the first recess and the first opening.

20 Claims, 30 Drawing Sheets

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2003/0194872 A1* | 10/2003 | Parikh ............... H01L 21/76838 438/694 |
| 2004/0102035 A1 | 5/2004 | Lee |
| 2018/0342459 A1 | 11/2018 | Chan et al. |

* cited by examiner

SEMICONDUCTOR DEVICE AND METHOD OF FORMING SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
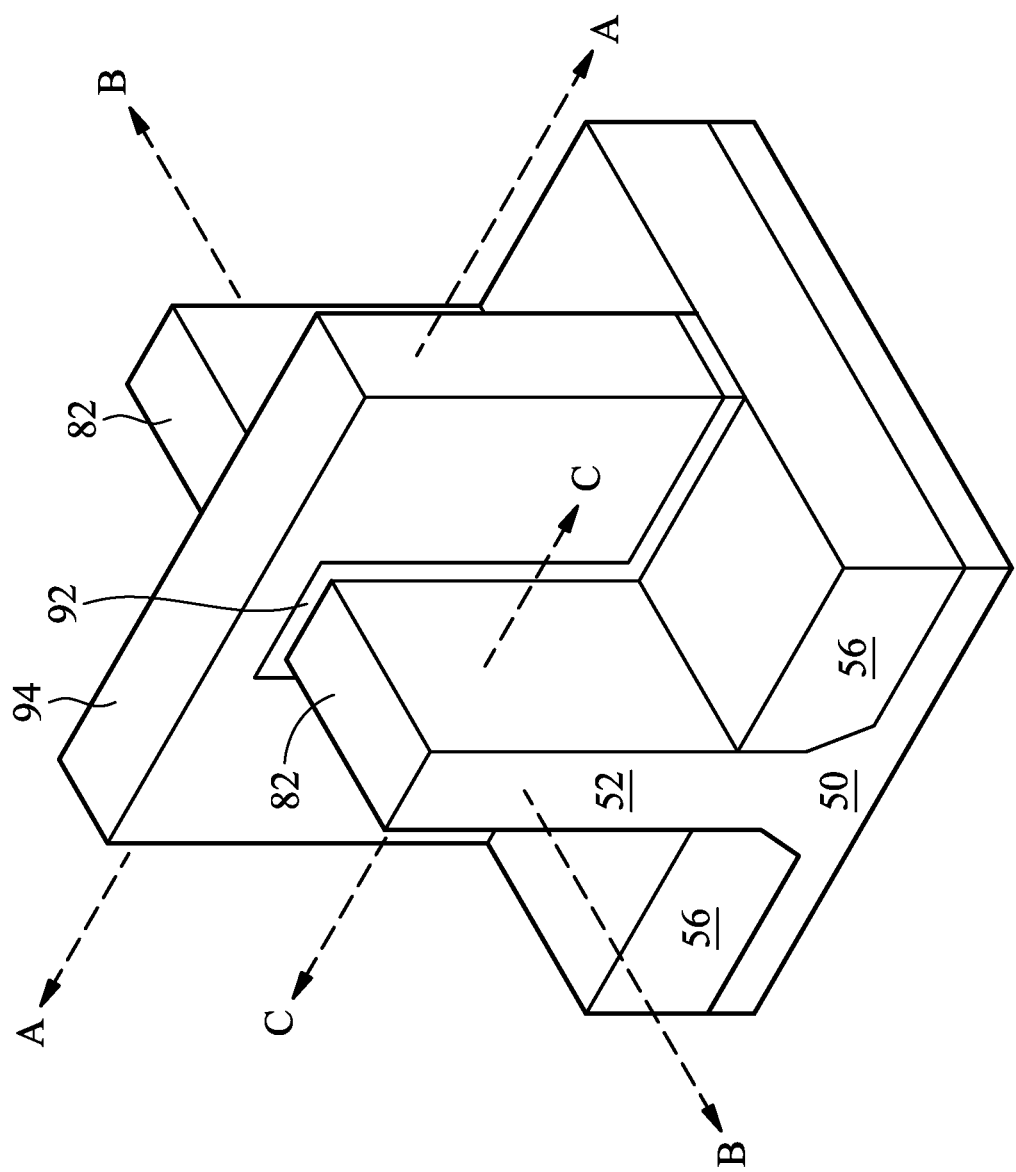
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Metal plugs, also referred to as conductive vias, formed using wet etch processes and the methods of forming the same are provided in accordance with some embodiments. The intermediate stages of forming the metal plugs are illustrated in accordance with some embodiments. Some variations of some embodiments are discussed. Throughout the various views and illustrative embodiments, like reference numbers are used to designate like elements. In some illustrated embodiments, the formation of Fin Field-Effect Transistors (FinFETs) is used as an example to explain the concept of the present disclosure. Other types of transistors such as planar transistors, Gate-All-Around (GAA) transistors, or the like may also adopt the embodiments of the present disclosure. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

In embodiments disclosed herein, methods for a wet etch process applied for wet breakthroughs of contact etch stop layers (CESLs) may produce unique CESL profiles that can reinforce subsequently formed metal contact plugs. Advantageous features of one or more embodiments disclosed herein may include larger contact areas resulting in lower contact resistance for metal contact plugs and tuning critical dimensions of CESLs without impacting interlayer dielectric (ILD) material dimensions. Lateral control over CESL etching can be exercised by the character of the wet etching process, which may prevent short circuiting of metal gates to source/drain regions. In addition to the embodiments disclosed herein, embodiments may be extensively used in semiconductor middle end of the line (MEoL) and back end of the line (BEoL) processes, including but not limited to processes for forming conductive vias or for performing post-via etch cleaning.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 26 are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, and 16A are illustrated along reference cross-section A-A illustrated in FIG. 1, and FIGS. 8B, 9B, 10B, 11B, 12B, 13B, 14B, 14C, 15B, 16B, 17A, 17B, 18, 19A, 19B, 20, 21, 22, 23, 24, 25, and 26 are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
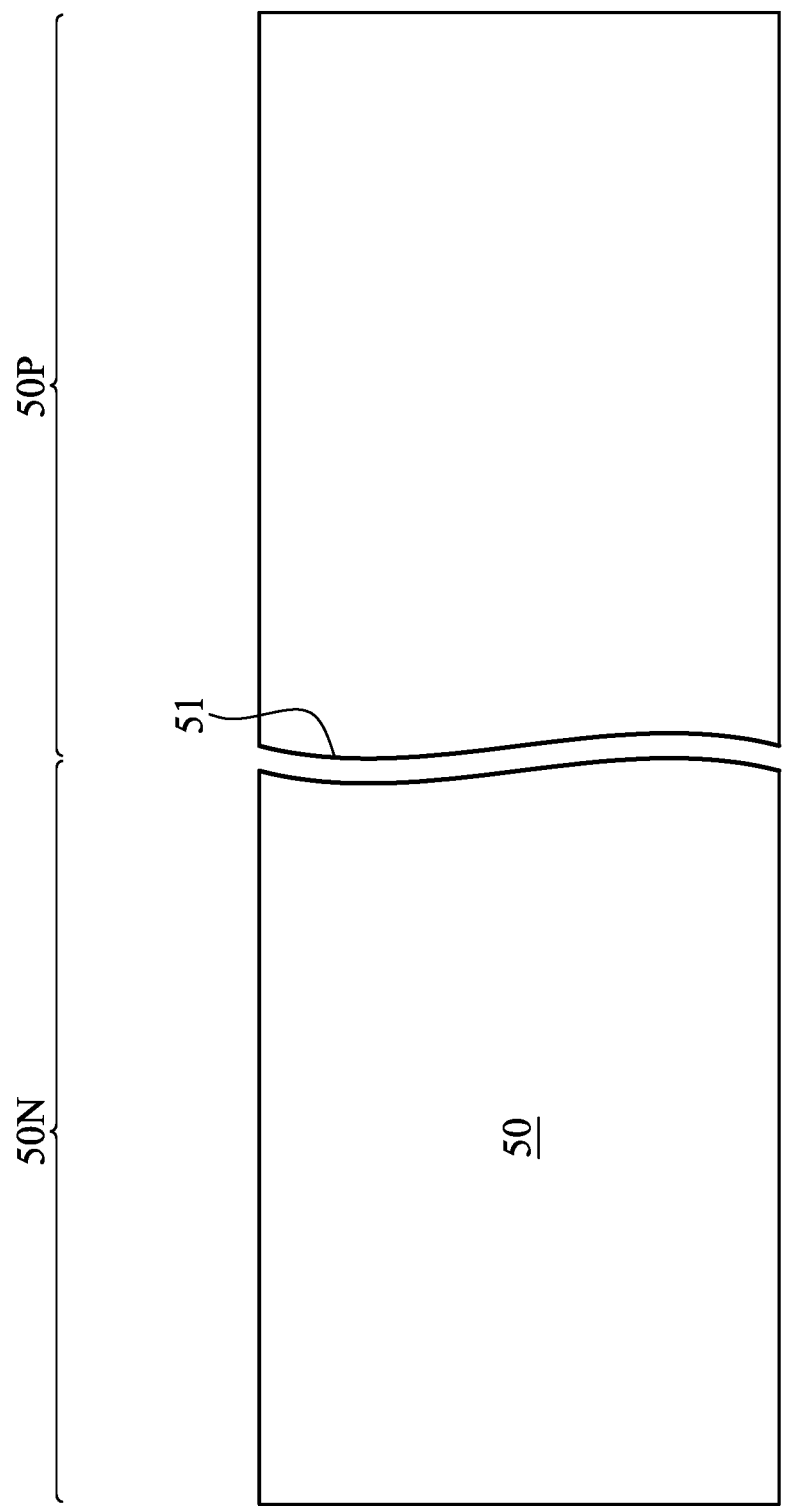
FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, 16B, 17A, 17B, 18, 19A, 19B, 20, 21, 22, 23, 24, 25, and 26 are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
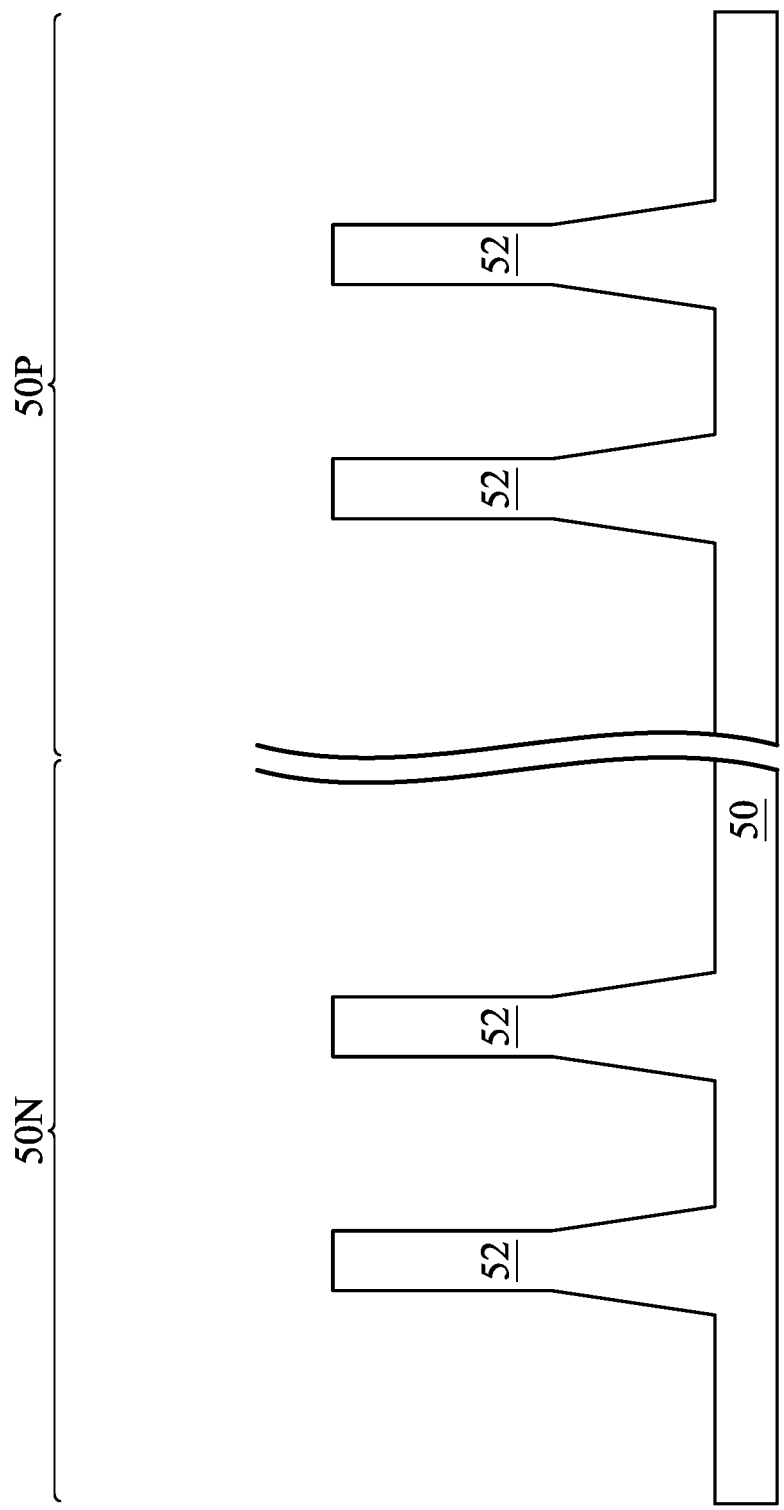

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
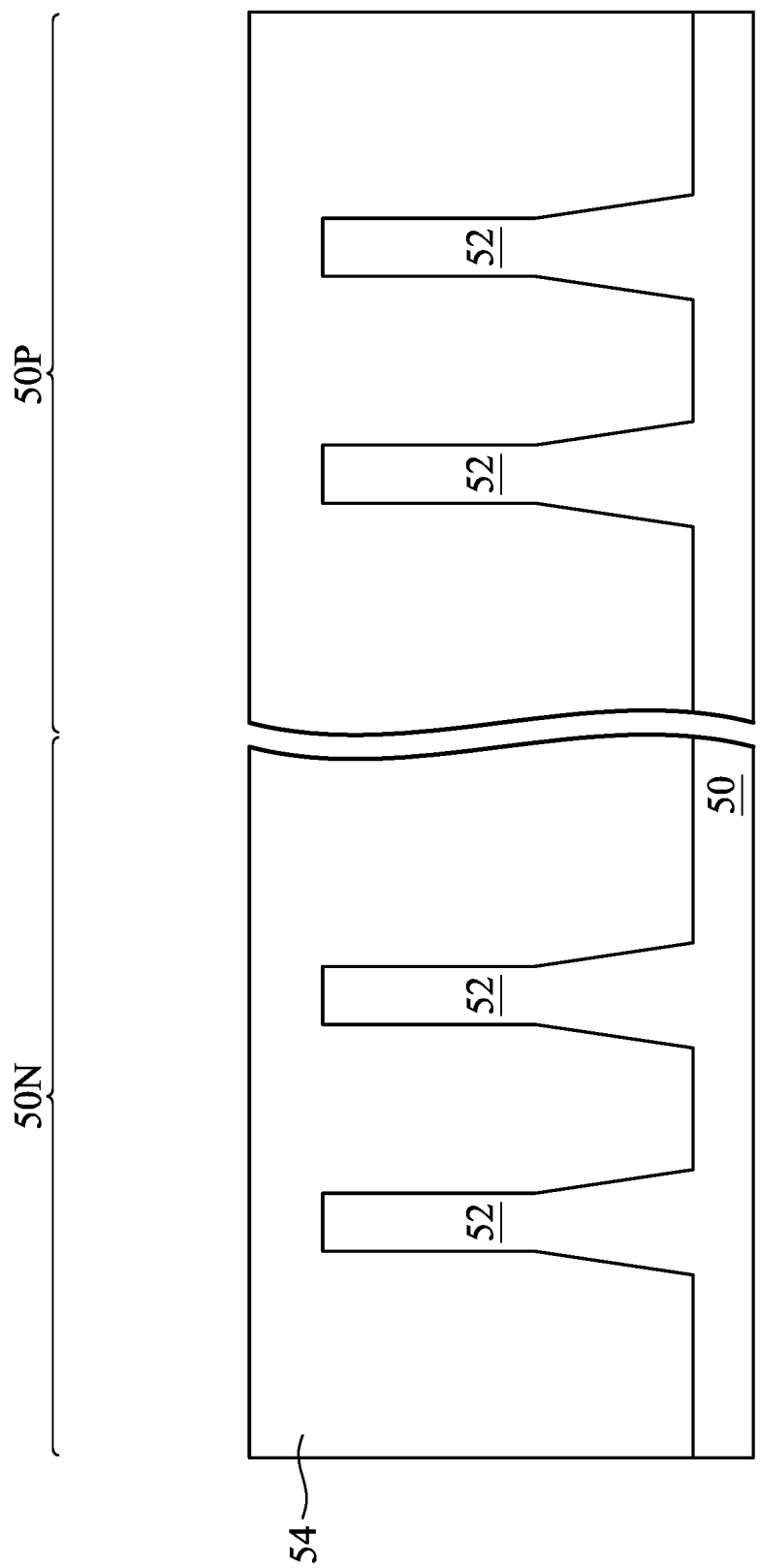

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
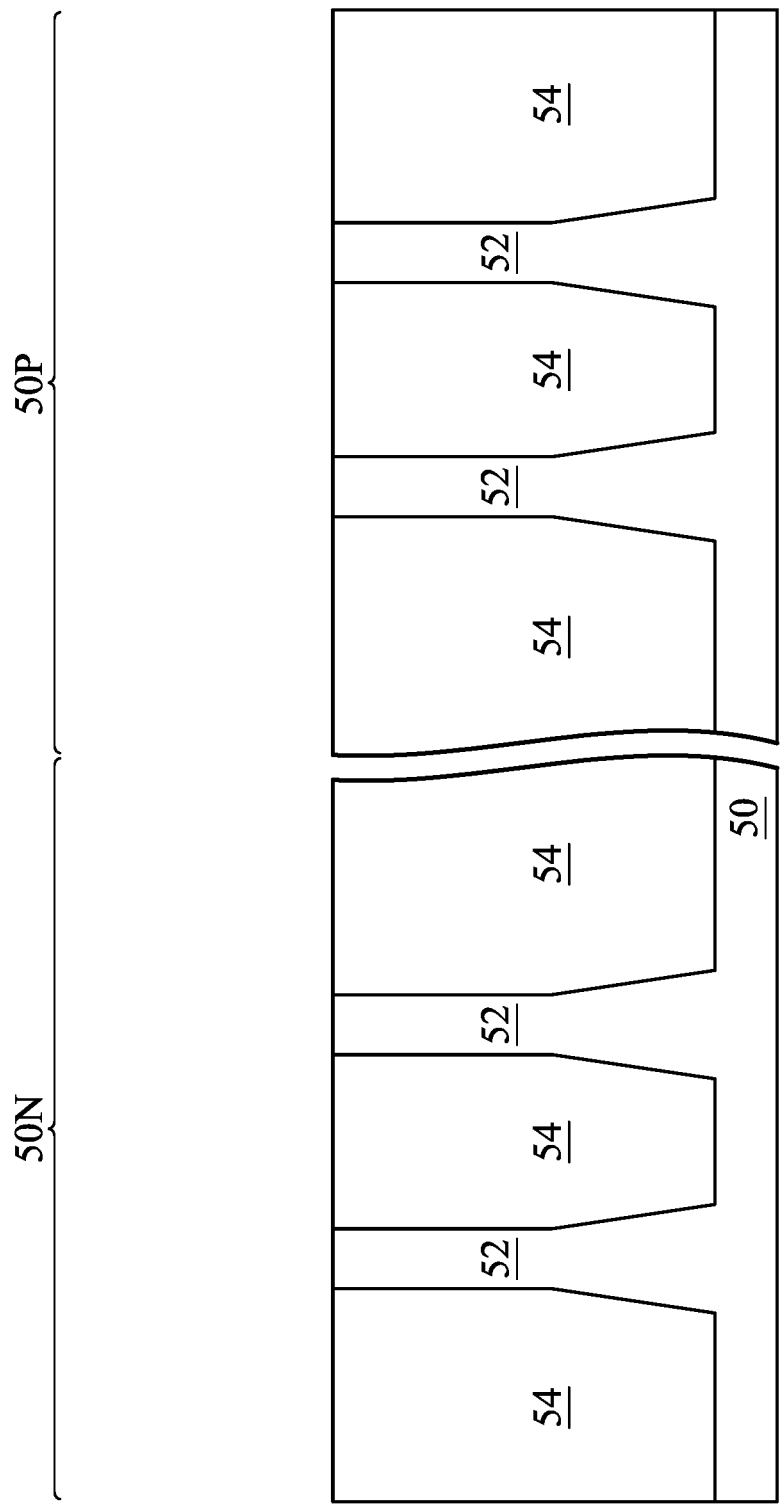

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
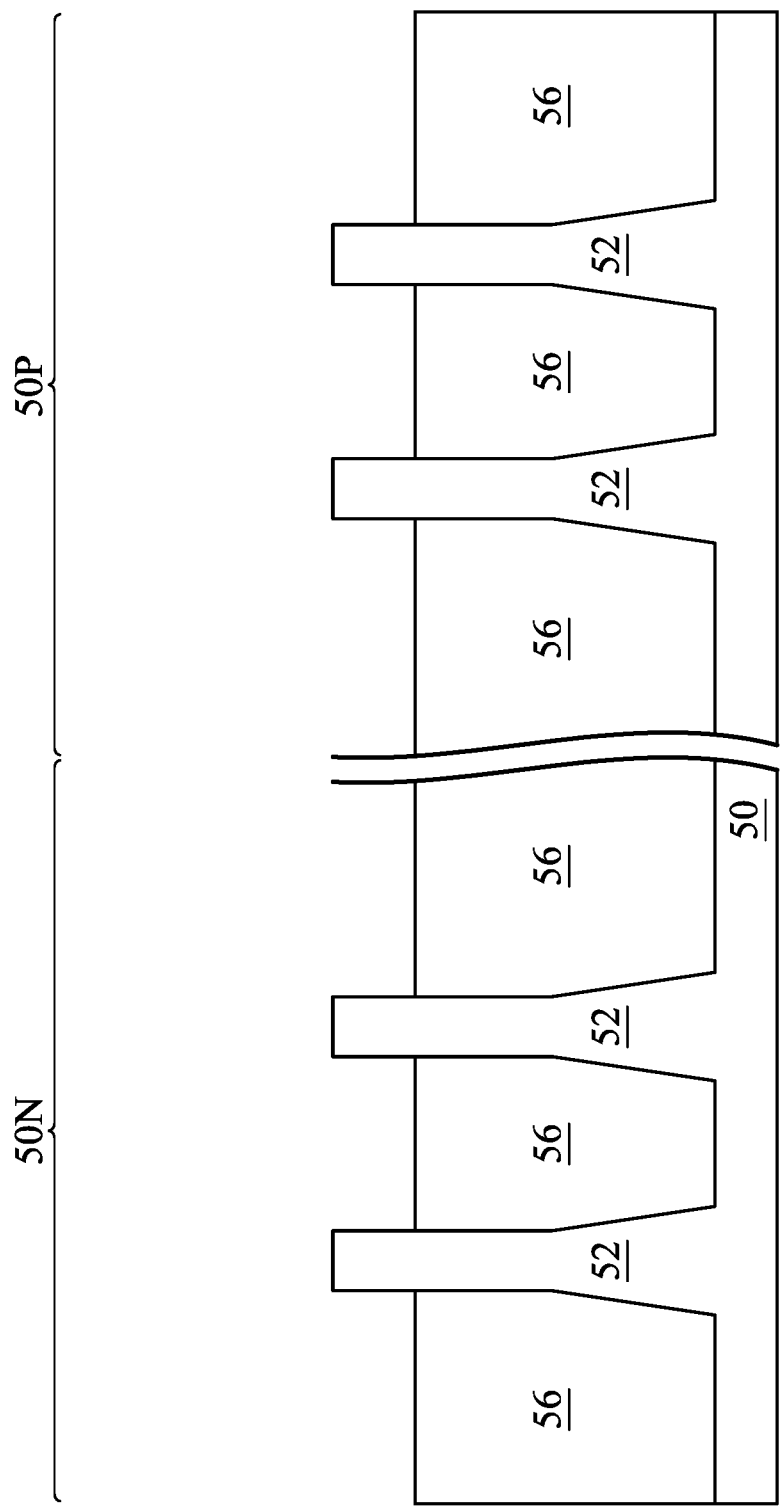

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as in a range of about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as in a range of about $10^{16}$ $cm^{-3}$ to about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
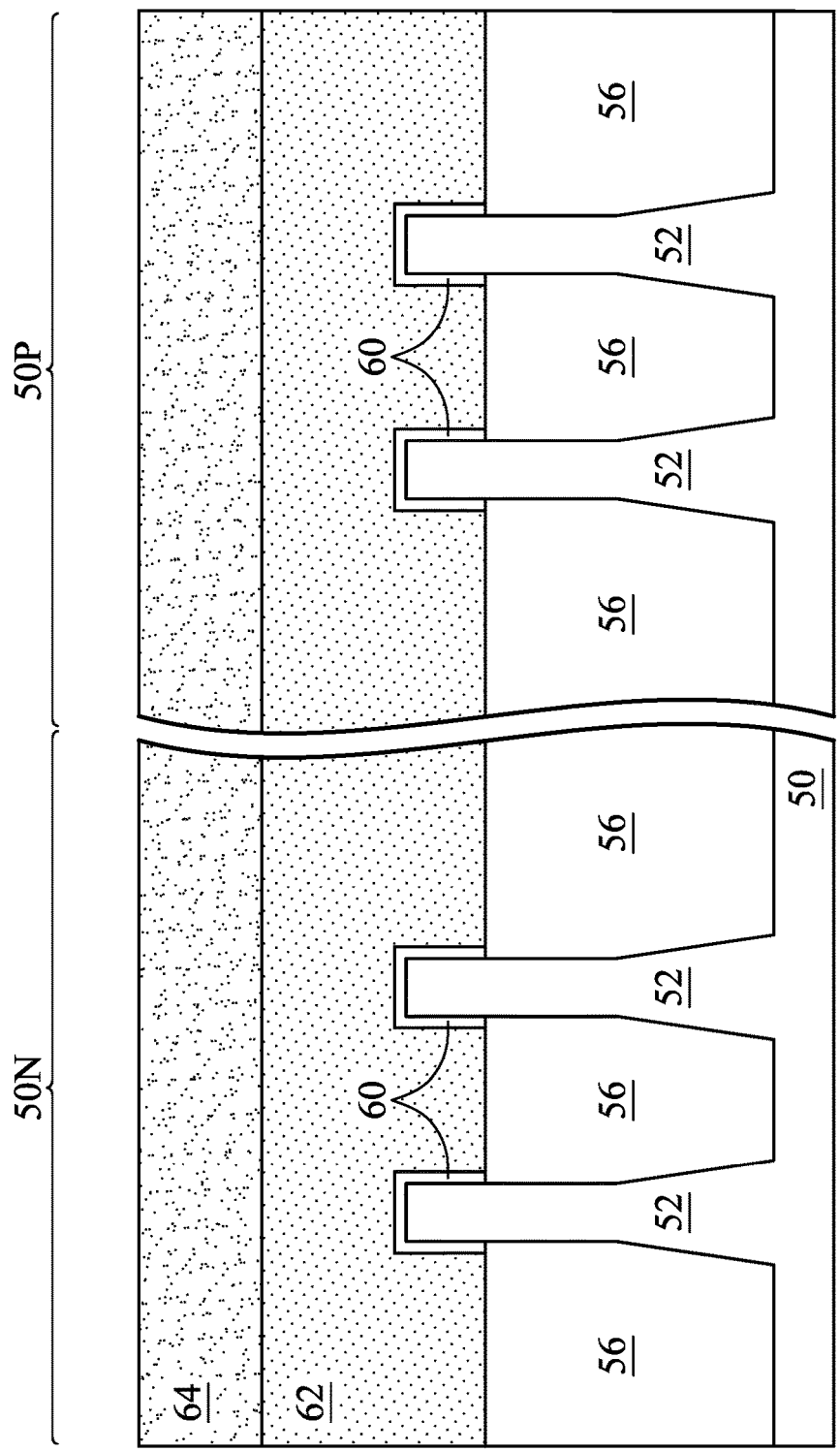

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 16B illustrate various additional steps in the manufacturing of embodiment devices. FIGS. 8A through 16B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
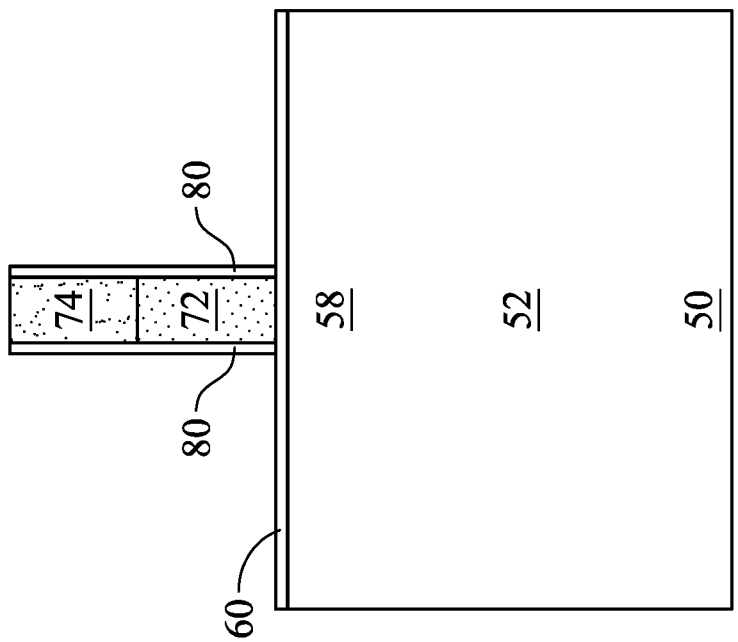
Figure 8A:
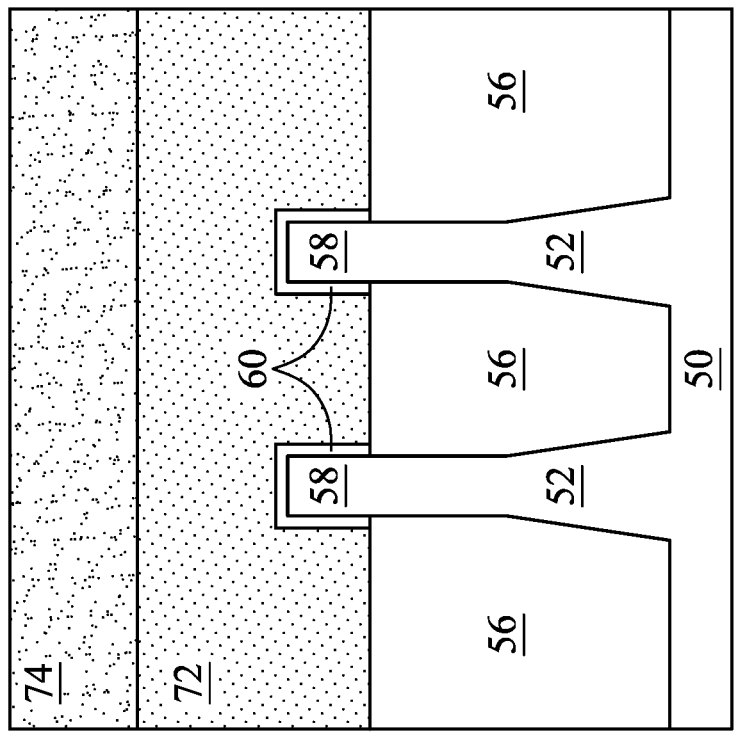

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
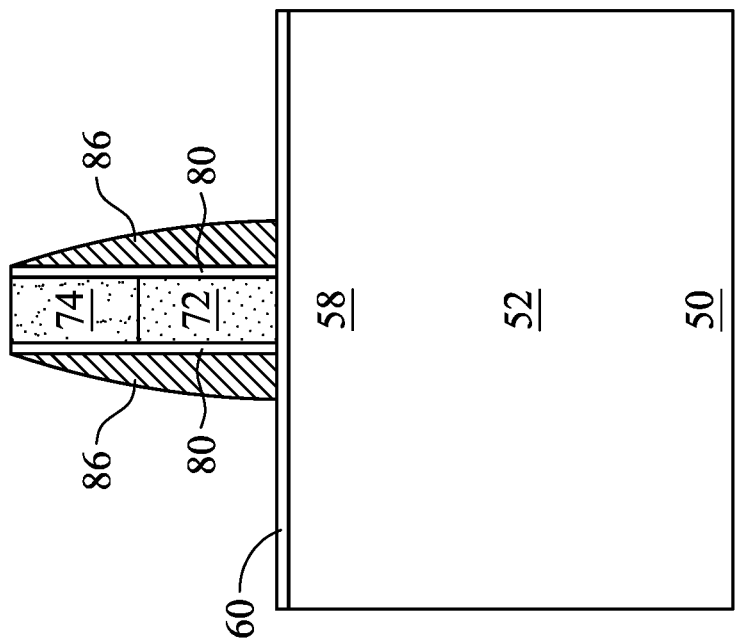
Figure 9A:
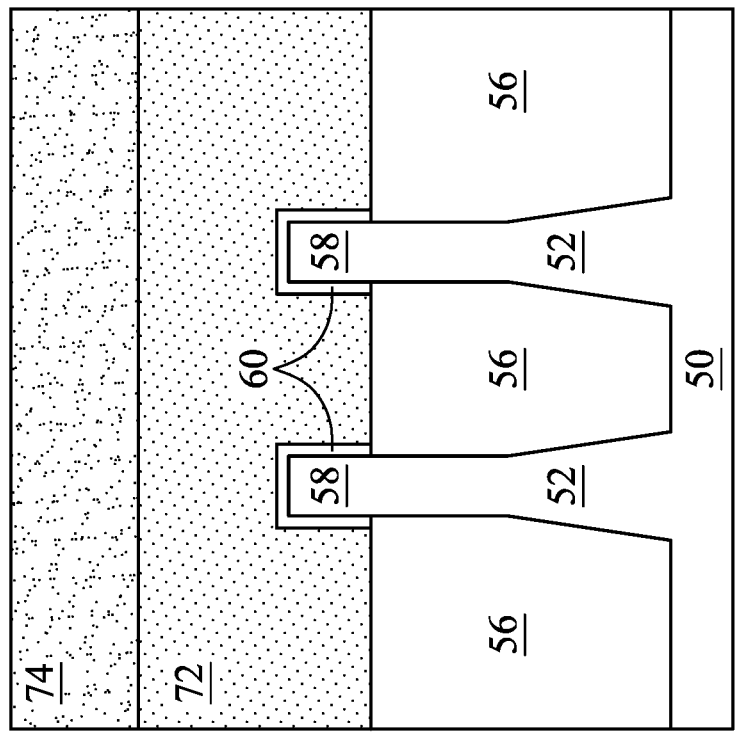

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers,) spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
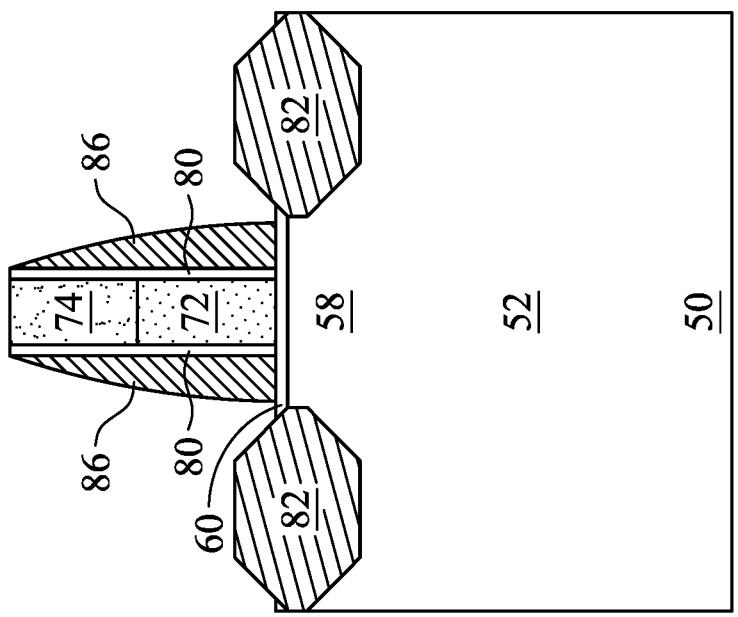
Figure 10A:
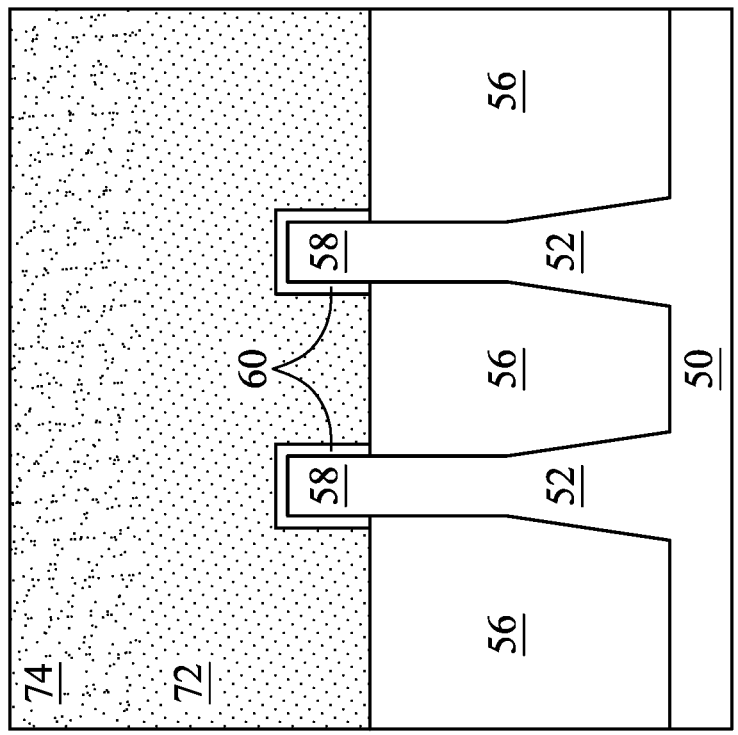
Figure 10C:
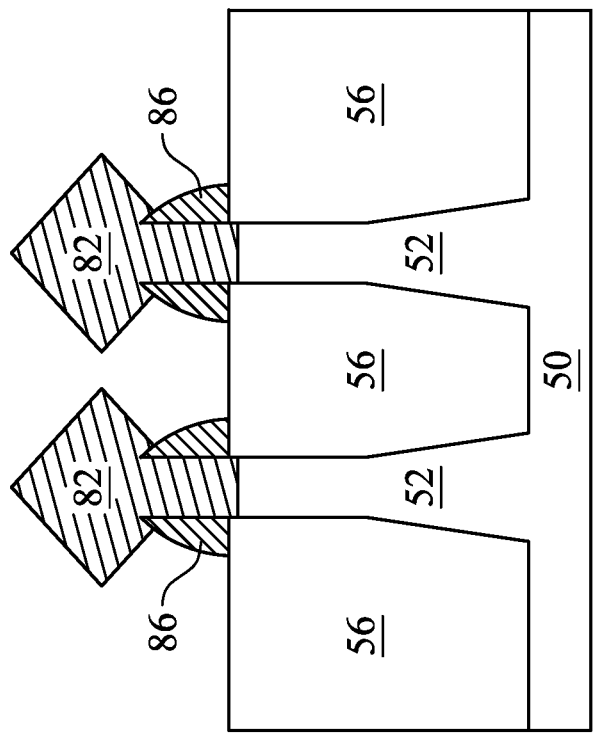
Figure 10D:
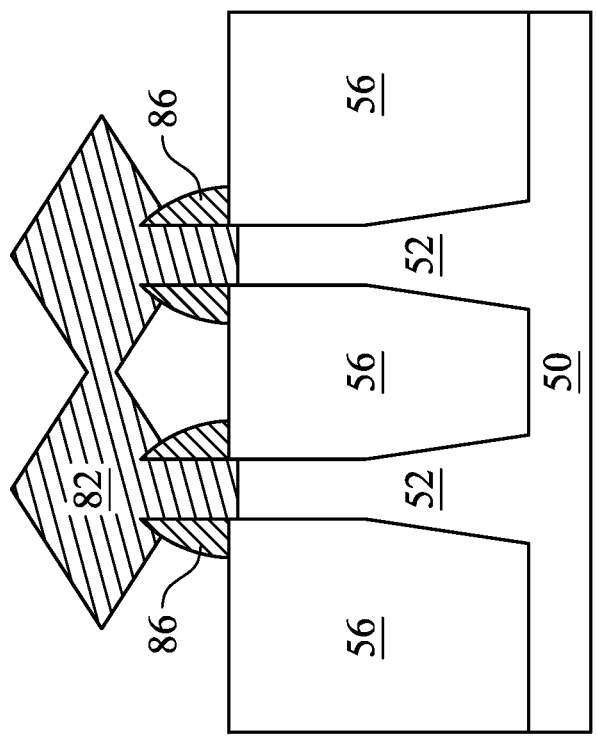

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration in a range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
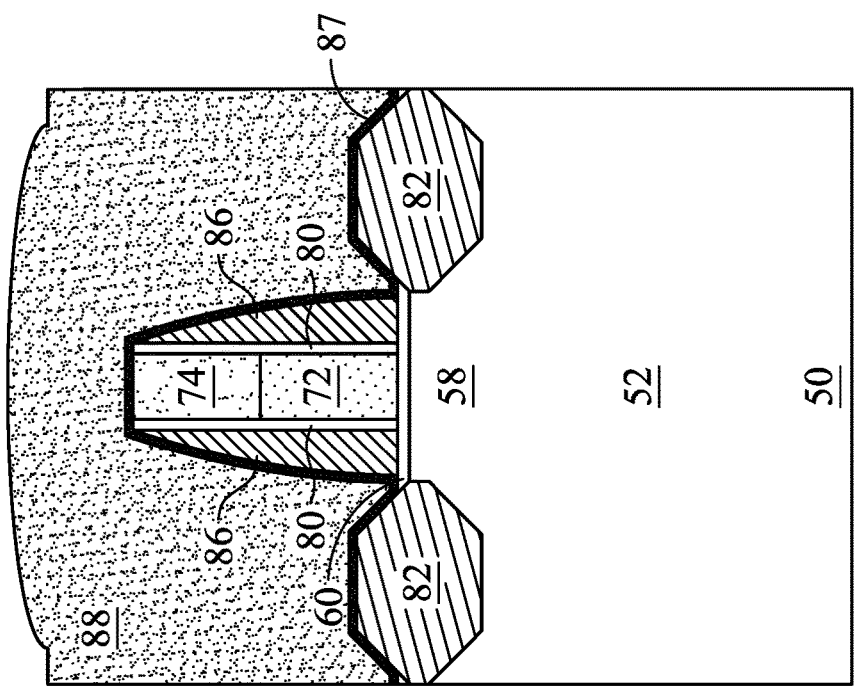
Figure 11A:
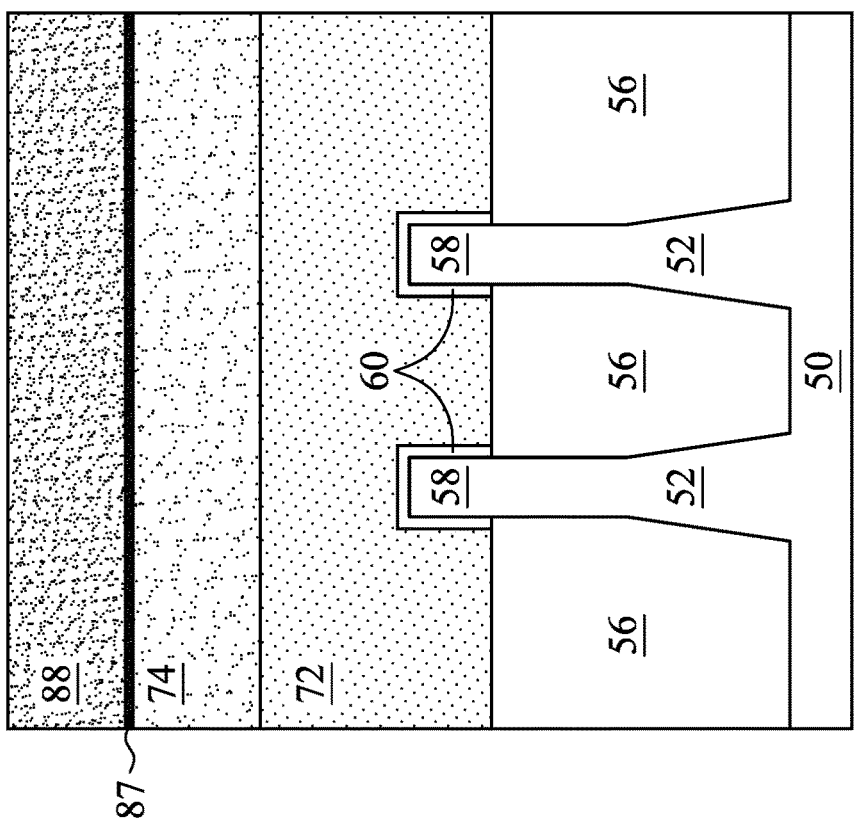

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a first contact etch stop layer (CESL) 87 is disposed between the first ILD 88 and the epitaxial source/drain regions 82, the masks 74, and the gate spacers 86. The first CESL 87 may comprise a dielectric material, such as, silicon nitride, silicon oxide, silicon oxynitride, or the like, having a different etch rate than the material of the overlying first ILD 88.

Figure 12B:
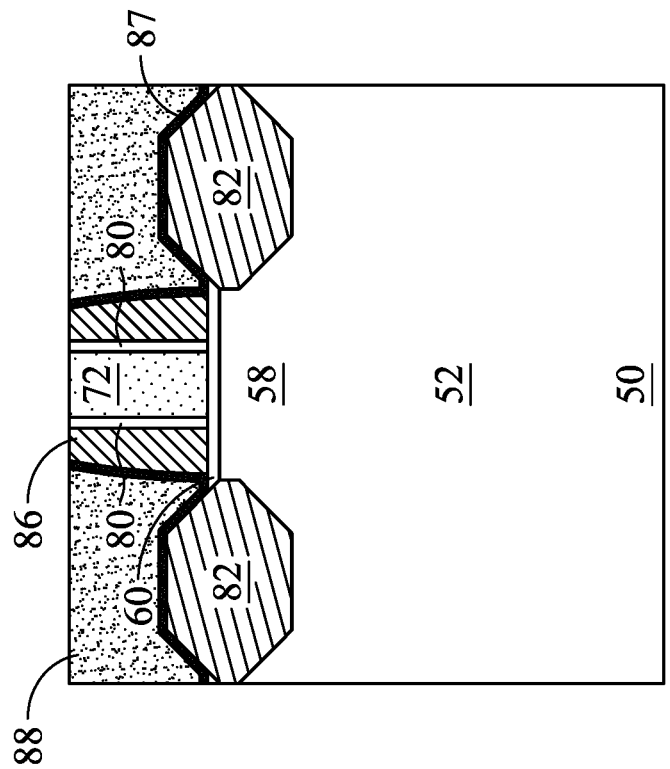
Figure 12A:
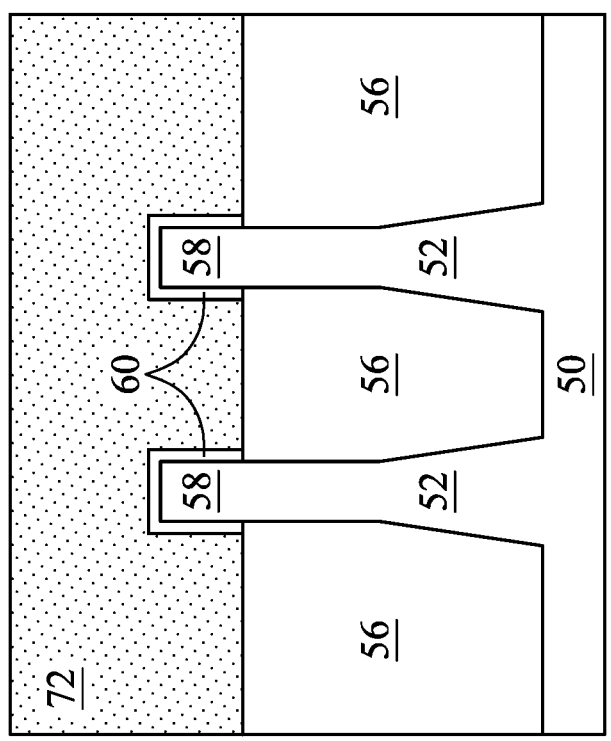

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 13B:
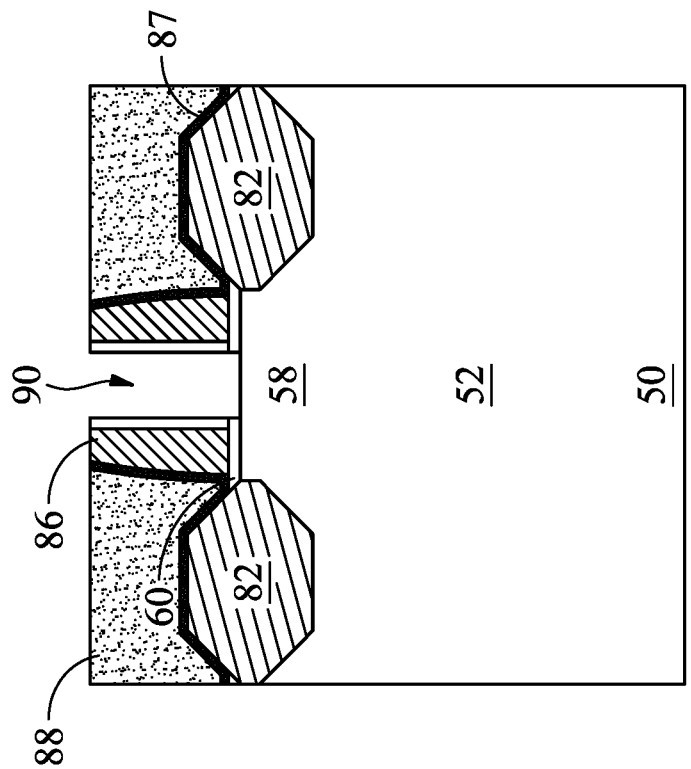
Figure 13A:
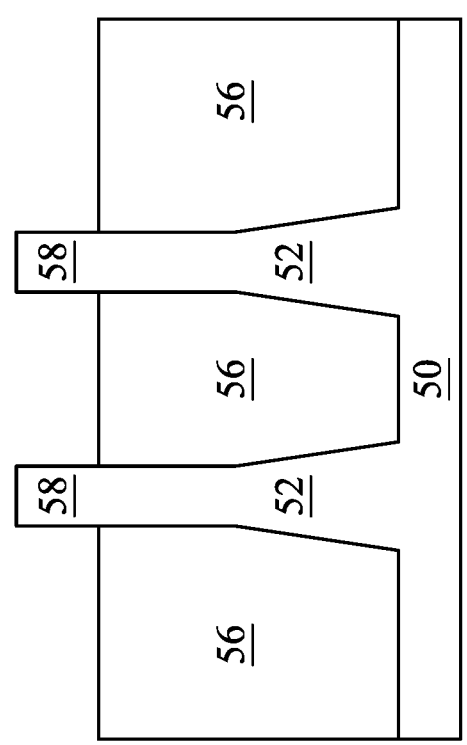

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
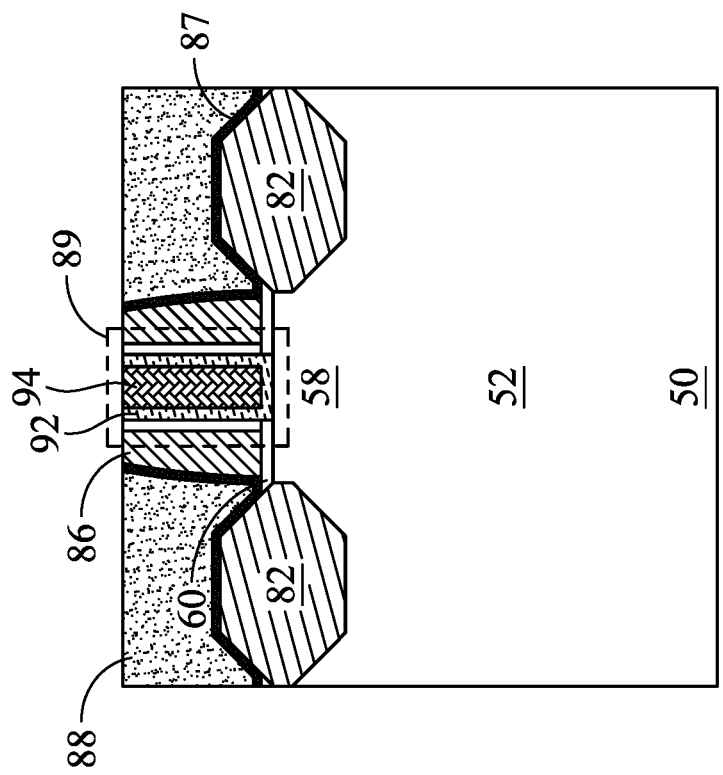
Figure 14A:
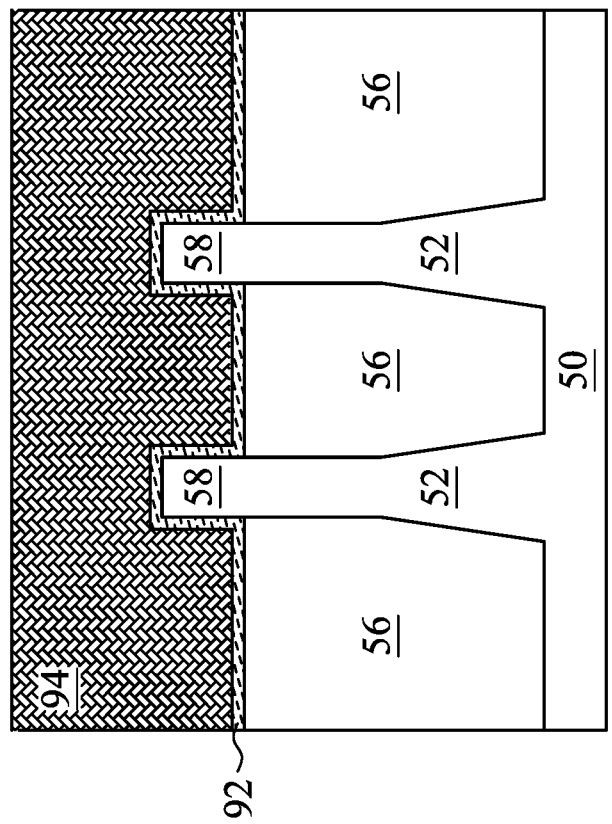
Figure 14C:
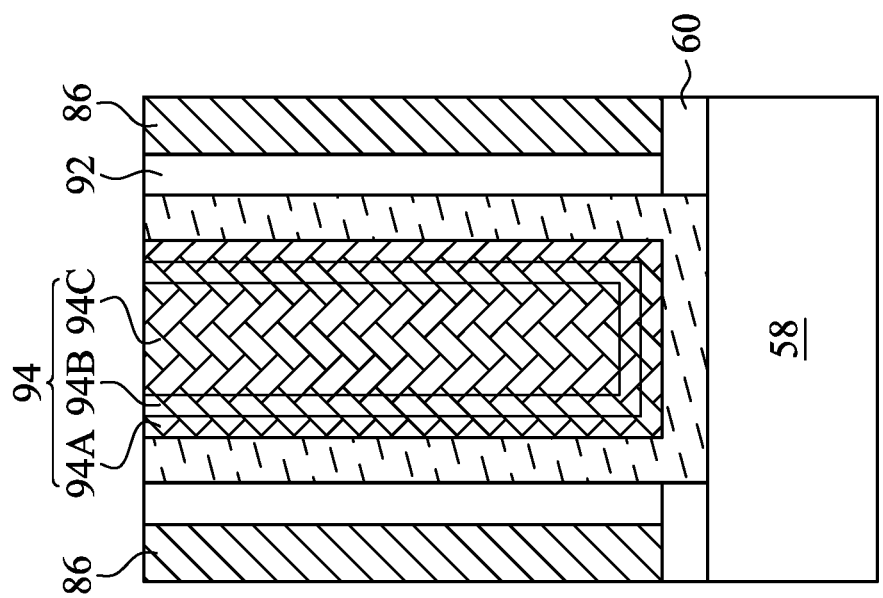

In FIGS. 14A and 14B, gate dielectric layers 92 and gate electrodes 94 are formed for replacement gates. FIG. 14C illustrates a detailed view of region 89 of FIG. 14B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 15B:
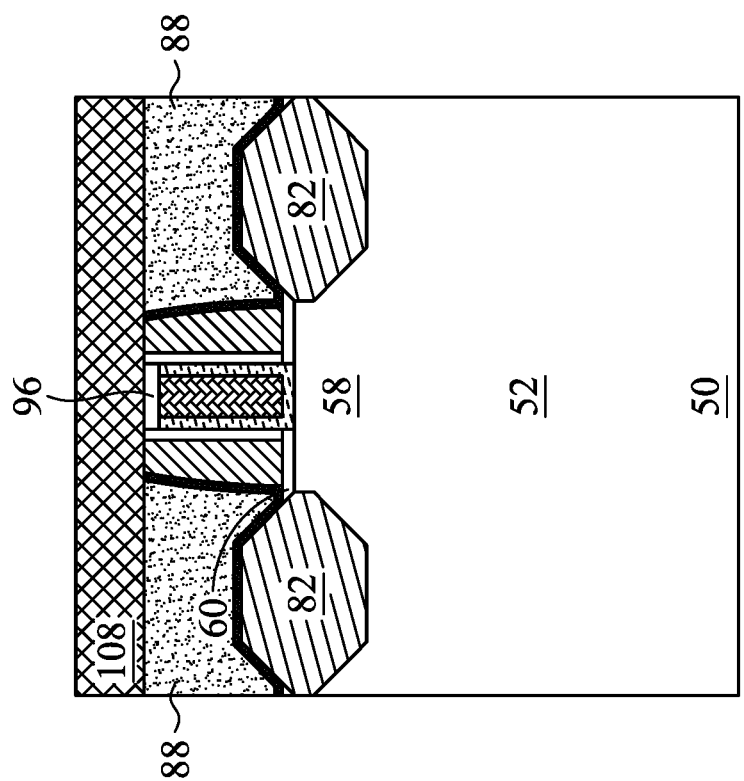
Figure 15A:
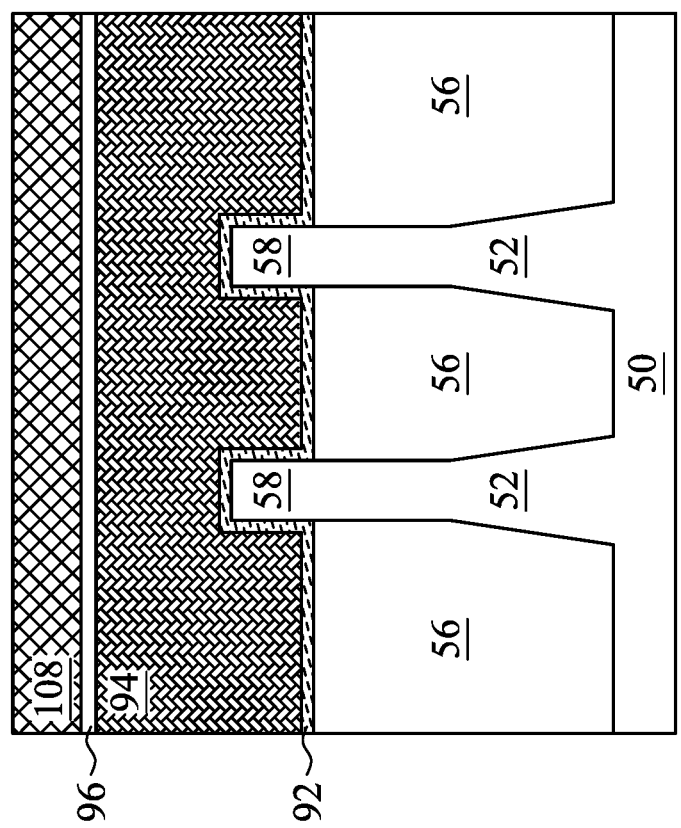

In FIGS. 15A and 15B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 15A and 15B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 16A and 16B) penetrate through the gate mask 96 to contact the top surface of the recessed gate electrode 94.

Figure 16B:
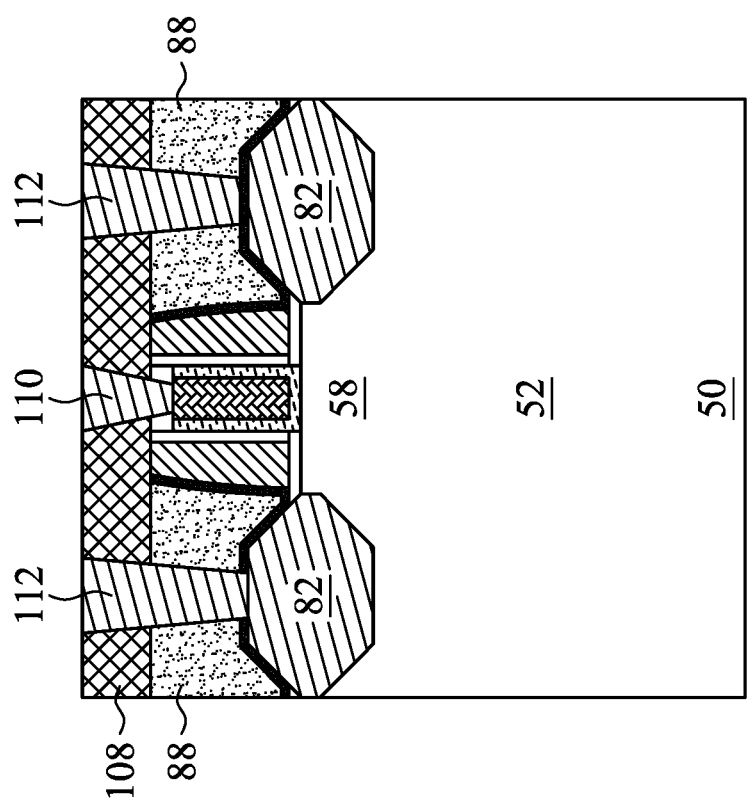
Figure 16A:
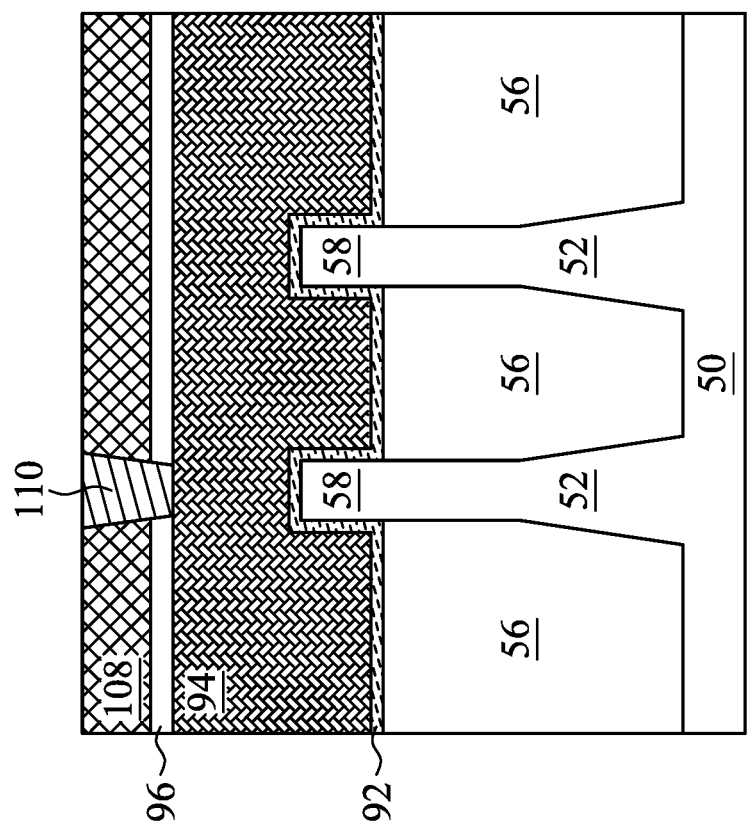

In FIGS. 16A and 16B, gate contacts 110 and source/drain contacts 112 are formed through the second ILD 108 and the first ILD 88 in accordance with some embodiments. Gate contacts 110 and source/drain contacts 112 may be referred to as metal contacts, metal features, or conductive features. Openings for the source/drain contacts 112 are formed through the first ILD 88 and second ILD 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Figure 17A:
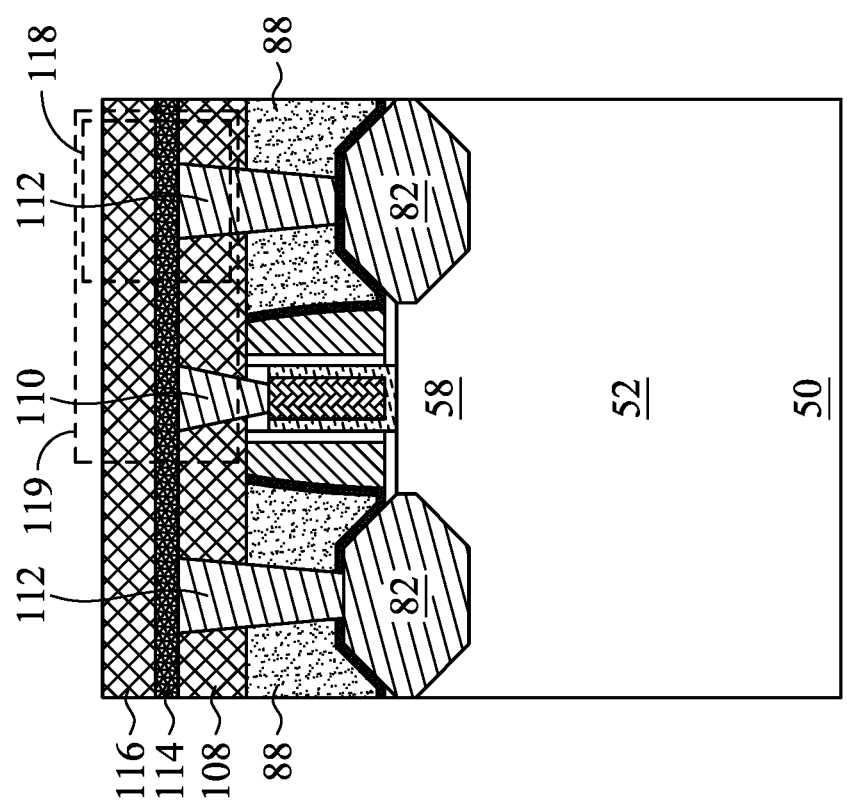
Figure 17B:
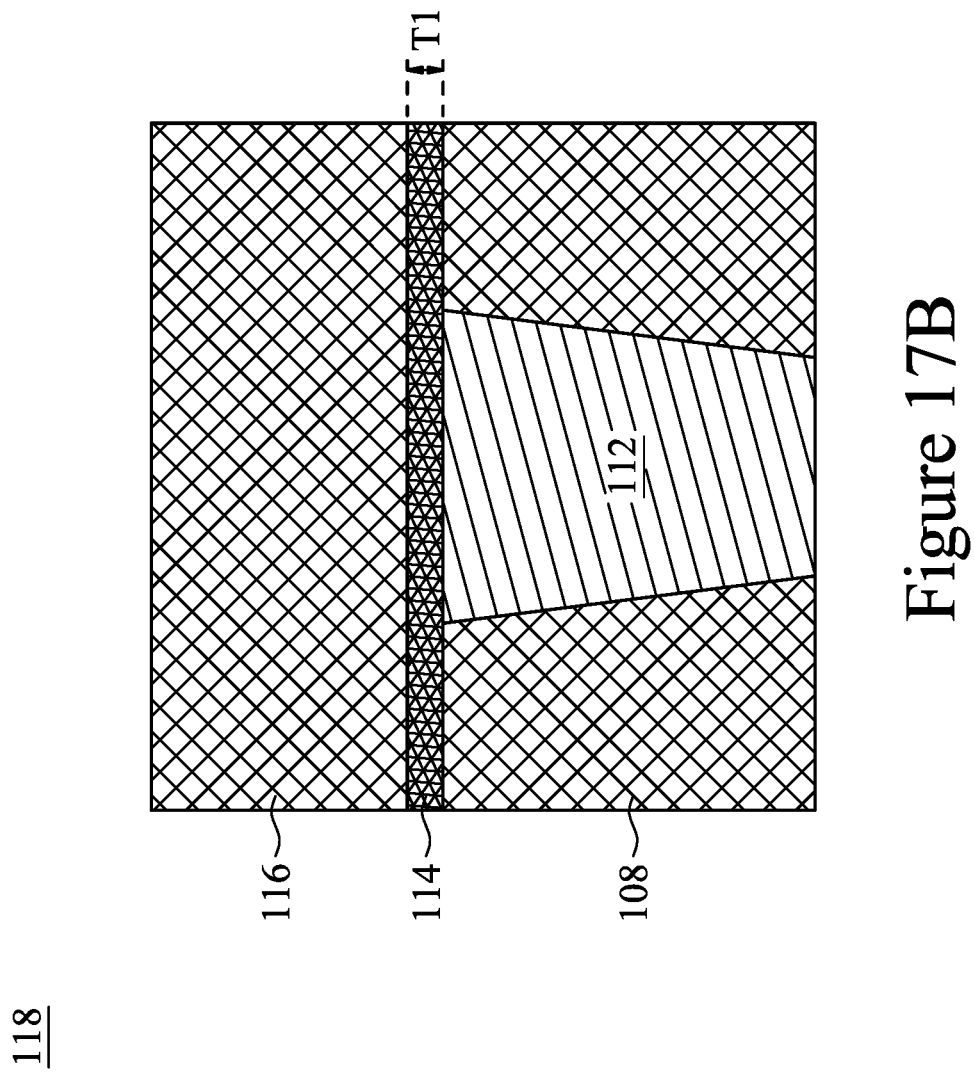

In FIG. 17A, which follows from FIG. 16B and is illustrated along cross-section B-B as illustrated in FIG. 1, a second contact etch stop layer (CESL) 114 and a third ILD 116 are formed. FIG. 17B illustrates a detailed view of region 118 of FIG. 17A. The second CESL 114 is formed on top surfaces of the second ILD 108, the gate contacts 110, and source/drain contacts 112. The second CESL 114 may comprise or be silicon nitride, silicon carbon nitride, silicon carbon oxide, carbon nitride, aluminum oxide, the like, or a combination thereof, and may be deposited by CVD, plasma enhanced CVD (PECVD), ALD, or another deposition technique. The second CESL 114 may have a thickness T1 in a range from about 1 nm to about 5 nm. The second CESL 114 having thickness T1 in a range from about 1 nm to about 5 nm may provide an efficient etch stop to prevent damage to the features under the second CESL 114. Embodiments having thickness T1 less than about 1 nm may not be thick enough to function as an efficient CESL layer. Embodiments having thickness T1 greater than about 5 nm may impede good profile control of a subsequent wet etch process. The third ILD 116 is formed on the second CESL 114 and may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, TEOS, a compound thereof, a composite thereof, the like, or a combination thereof. The third ILD 116 may be deposited by spin-on, CVD, flowable CVD (FCVD), PECVD, PVD, or another deposition technique. In some embodiments, a thickness of the third ILD 116 can be in a range from about 20 nm to about 70 nm. The ILD 116 having a thickness in a range from about 20 nm to about 70 nm may provide for enhanced via etch profile control and ILD CMP topography control. Embodiments in which the ILD 116 has thickness less than about 20 nm may be disadvantageous for CMP topography control. Embodiments in which the ILD 116 has thickness greater than about 70 nm may be disadvantageous for etch profile and metal plug processes.

Figure 18:
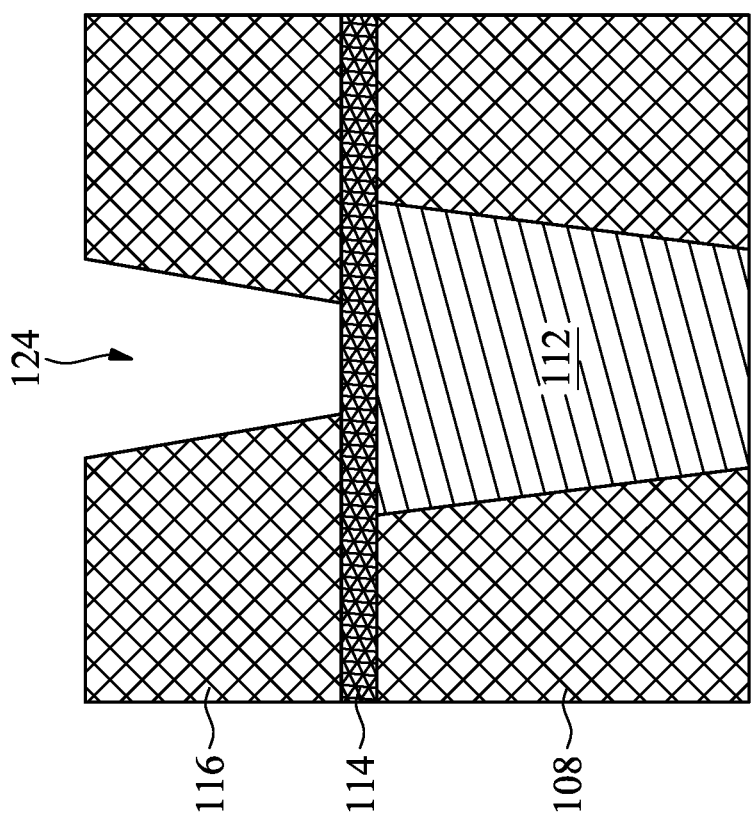

In FIG. 18, which follows from FIG. 17B, an opening 124 is formed through the third ILD 116 to the second CESL 114. The opening 124 is formed directly above the source/drain contact 112. The opening may be formed by acceptable photolithography and dry etch processes. For example, the dry etching process may include an anisotropic dry etch process using reaction gas(es) such as CF4, CH3F, C4F6, the like, or combinations thereof to etch through the third ILD 116.

Figure 19A:
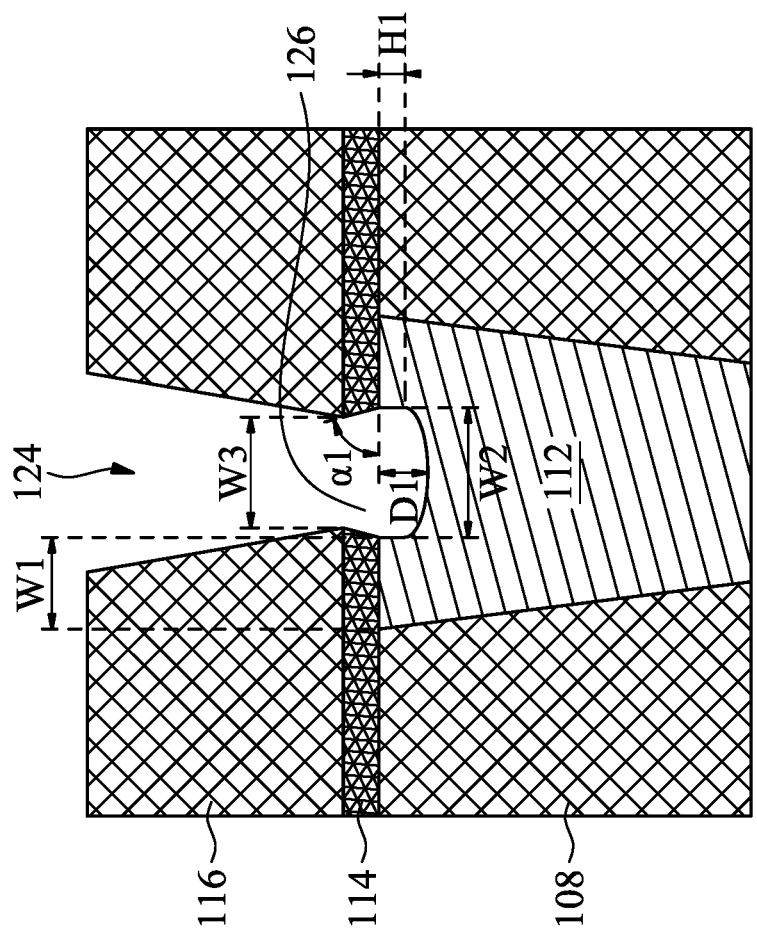

In FIG. 19A, a recess 126 is formed by a wet breakthrough that etches through the second CESL 114 into the top surface of the source/drain contact 112. The recess 126 may be formed due to the wet breakthrough penetrating the second CESL 114 and etching a top portion of the source/drain contact 112. The wet breakthrough is performed with a wet etch process comprising deionized (DI) water, $CO_2$ blended DI water, $O_3$ blended DI water, $H_2O_2$ blended DI water, $NH_4OH$ solution, SC-1, SC-2, the like, or a combination thereof.

The $H_2O_2$ blended DI water may have a concentration of $H_2O_2$ to DI water in a range from about 1:5 to about 1:30. A concentration of $H_2O_2$ to DI water in a range from about 1:5 to about 1:30 may provide enhanced selectivity of the wet etch through the second CESL 114 and compatibility with the metal of the source/drain contact 112. A concentration of $H_2O_2$ to DI water of more than 1:5 may cause damage to the metal of the source/drain contact 112 or to other materials underlying the second CESL 114. A concentration of $H_2O_2$ to DI water of less than 1:30 may produce a low CESL etch rate that is too low to be practical for the etch through the second CESL 114.

The $NH_4OH$ solution may have a concentration of $NH_4OH$ to DI water in a range from about 1:5 to about 1:2000. A concentration of $NH_4OH$ to DI water in a range from about 1:5 to about 1:2000 may provide enhanced selectivity of the wet etch through the second CESL 114 and compatibility with the metal of the source/drain contact 112. A concentration of $NH_4OH$ to DI water of more than 1:5 may cause damage to the metal of the source/drain contact 112 or to other materials underlying the second CESL 114. A concentration of $NH_4OH$ to DI water of less than 1:2000 may produce a low CESL etch rate that is too low to be practical for the etch through the second CESL 114.

The SC-1, or Ammonia hydroxide-hydrogen Peroxide-water Mixture (APM), is a solution of $NH_3$, $H_2O_2$, and DI water at concentrations in a range from about 1:1:5 to about 1:1:400. A ratio of concentrations of $NH_3$, $H_2O_2$, and DI water in a range from about 1:1:5 to about 1:1:400 may provide enhanced selectivity of the wet etch through the second CESL 114 and compatibility with the metal of the source/drain contact 112. A ratio of concentrations of $NH_3$, $H_2O_2$, and DI water of more than 1:1:5 may cause damage to the metal of the source/drain contact 112 or to other materials underlying the second CESL 114. A ratio of concentrations of $NH_3$, $H_2O_2$, and DI water of less than 1:1:400 may produce a low CESL etch rate that is too low to be practical for the etch through the second CESL 114.

The SC-2 is a solution of HCl, $H_2O_2$, and DI water at concentrations in a range from about 1:1:5 to about 1:1:400. A ratio of concentrations of HCl, $H_2O_2$, and DI water in a range from about 1:1:5 to about 1:1:400 may provide enhanced selectivity of the wet etch through the second CESL 114 and compatibility with the metal of the source/drain contact 112. A ratio of concentrations of HCl, $H_2O_2$, and DI water of more than 1:1:5 may cause damage to the metal of the source/drain contact 112 or to other materials underlying the second CESL 114. A ratio of concentrations of HCl, $H_2O_2$, and DI water of less than 1:1:400 may produce a low CESL etch rate that is too low to be practical for the etch through the second CESL 114.

Further referring to FIG. 19A, the wet etch process is performed for a time interval in a range from about 30 seconds to about 300 seconds. Performing the wet etch process in a range from about 30 seconds to about 300 seconds may provide a breakthrough or etch of the second CESL 114 and an etching of the underlying conductive feature, such as e.g. the source/drain contact 112 to a depth of up to 10 nm. Performing the wet etch process for less than about 30 seconds may cause an insufficient CESL breakthrough that does not etch through the second CESL 114. Performing the wet etch process for more than about 300 seconds may cause damage to the metal of the source/drain contact 112 or to other materials underlying the second CESL 114. The process time can be controlled to adjust the size and shape of the recess 126. For example, a process time of 30 seconds will produce a recess 126 with a depth D1 measured between a top surface of the source/drain contact 112 and a lowest point of the recess 126 of 3 nm, and a process time of 100 seconds will produce a recess 126 with a depth D1 of 10 nm. The wet etch process is performed at a temperature in a range of room temperature (RT), e.g. about 20° C. to about 25° C., to about 65° C. Performing the wet etch process at a temperature in a range of RT to about 65° C. may provide enhanced selectivity of the wet etch through the second CESL 114 and compatibility with the metal of the source/drain contact 112. Performing the wet etch process at a temperature less than RT may cause an insufficiently low CESL etch rate. Performing the wet etch process at a temperature greater than about 65° C. may cause damage to the metal of the source/drain contact 112 or to other materials underlying the second CESL 114.

In some embodiments, the recess 126 has sidewalls and a concave bottom surface, as illustrated in FIG. 19A. The sidewalls of the recess 126 may be substantially straight, which may be produced by performing the wet etch process for about 30 seconds. The sidewalls of the recess 126 may have a height H1 measured from the bottom surface of the second CESL 114 to the bottom surface of the recess 126 in a range of about 3 nm to about 15 nm, which provides suitable conditions for a metal plug, such as a low resistance interface. The height H1 being smaller than about 3 nm may be unfavorable for metal depositions, which could lead to defects such as a deposited metal plug breaking apart from the source/drain contact 112 or other conductive feature being recessed. The height H1 being larger than about 15 nm may cause damage to the metal of the source/drain contact 112 or to other materials underlying the second CESL 114.

A bottom critical dimension (BCD) of the boundary between the bottom surface of the second CESL 114 and the top surface of the source/drain contact 112 may have a width less than about 10 nm. The BCD between the second CESL 114 and the source/drain contact 112 being less than about 10 nm may provide a larger interface for a metal plug formed later above the source/drain contact 112 which could lead to low interface resistance between the source/drain contact 112 and the metal plug. The BCD between the second CESL 114 and the source/drain contact 112 being larger than about 10 nm may cause a smaller interface for a metal plug, which could lead to undesirable higher interface resistance.

The recess 126 may have a width W2, or lower width W2, measured between opposite sidewalls in a range of about 8 nm to about 52 nm. The lower width W2 being in the range of about 8 nm to about 52 nm may provide a favorable interface area for a metal plug. The lower width W2 being smaller than about 8 nm may lead to an insufficiently large interface area for a metal plug. The lower width W2 being greater than about 52 nm may lead to damage of the source/drain contact 112. The recess 126 may have a width W3, or upper width W3, measured between top points on opposite sidewalls of the second CESL 114 in a range of about 8 nm to about 40 nm. The upper width W3 is smaller than the lower width W2 with a difference between W2 and W3 in a range of less than about 12 nm. The upper width W3 being in the range of about 8 nm to about 40 nm may provide a favorable interface area for a metal plug. The upper width W3 being smaller than about 8 nm may impede the formation of a metal plug in and above the recess. The upper width W3 being greater than about 40 nm may lead to electrical shorts between metal plugs formed later.

In some embodiments, the forming of the recess 126 may produce a CESL angle α1 in a range of about 0 degrees to about 45 degrees between a sidewall of the second CESL 114 and an upper surface of the recess 126. The angle α1 being in the range of about 0 degrees to about 45 degrees may provide a favorably large area for a metal plug to be formed. In some embodiments, the forming of the recess 126 may produce a CESL angle α1 in a range of about 0 degrees to about 90 degrees, such as 90 degrees, between a sidewall of the second CESL 114 and an upper surface of the recess 126. Lateral control over the CESL critical dimensions, such as e.g. W1, can be exercised by the character of the wet etching process, which may prevent short circuiting of metal gates to source/drain regions.

Still referring to FIG. 19A, the recess 126 may be rinsed and dried with a chemical such as isopropyl alcohol (IPA) or acetone. The chemical rinse may be applied for a time interval in a range of about 5 seconds to about 60 seconds. The chemical rinse may be applied at a temperature between room temperature (20° C. to 25° C.) and about 65° C. The recess may be allowed to dry after the rinse for a time interval in a range of about 5 seconds to about 60 seconds.

Figure 19B:
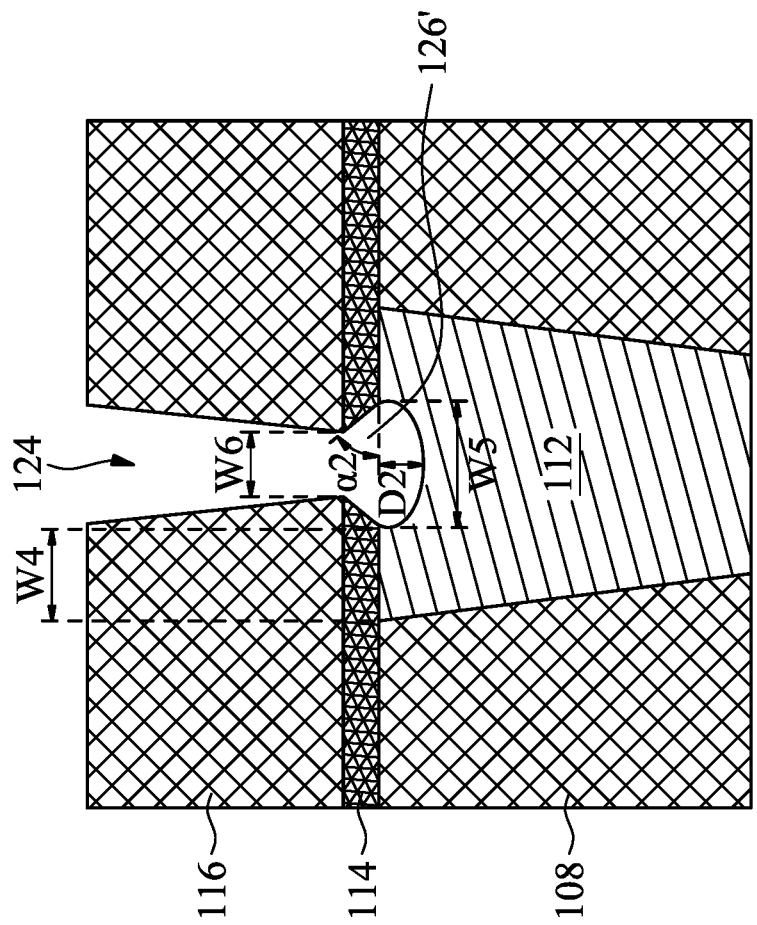

FIG. 19B illustrates another embodiment in which a recess 126' is formed with a concave bottom up to a surface level with the bottom surface of the second CESL 114. This shape of the recess 126' may be produced by defining a smaller upper width W3 with a lithography process and performing a longer wet etch process. The recess 126' may be formed to have a depth D2 measured between a top surface of the source/drain contact 112 and a lowest point of the recess 126' in a range of about 3 nm to about 15 nm, which provides suitable conditions for forming a metal plug, such as low resistance interface. The depth D2 being smaller than about 3 nm may be unfavorable for metal depositions, which could lead to defects such as a deposited metal plug breaking apart from the source/drain contact 112 or other conductive feature being recessed. The depth D2 being larger than about 15 nm may cause damage to the metal of the source/drain contact 112 or to other materials underlying the second CESL 114.

The BCD between the second CESL 114 and the source/drain contact 112 may have a width W4 in a range of less than about 10 nm. The width W4 being in the range of less than about 10 nm may provide a larger interface for a metal plug formed later above the source/drain contact 112 which could lead to low interface resistance between the source/drain contact 112 and the metal plug. The width W4 being larger than about 10 nm may cause a smaller interface for a metal plug, which could lead to undesirable higher interface resistance.

The recess 126' may have a width W5, or lower width W5, measured between bottom points on opposite sidewalls of the second CESL 114 in a range of about 8 nm to about 32 nm. The lower width W5 being in the range of about 8 nm to about 32 nm may provide a favorable interface area for a metal plug. The lower width W5 being smaller than about 8 nm may lead to an insufficiently large interface area for a metal plug. The lower width W5 being greater than about 32 nm may lead to damage of the source/drain contact 112. The recess 126' may have a width W6, or upper width W6, measured between top points on opposite sidewalls of the second CESL 114 in a range of about 8 nm to about 20 nm. The upper width W6 is smaller than the lower width W5 with a difference between W5 and W6 less than about 12 nm. The upper width W6 being in the range of less than about 12 nm about 8 nm to about 20 nm may provide a favorable interface area for a metal plug. The upper width W6 being smaller than about 8 nm may impede the formation of a metal plug in and above the recess. The upper width W6 being greater than about 20 nm may lead to electrical shorts between metal plugs formed later.

The forming of the recess 126' may produce a CESL angle α2 of about 10 degrees to about 45 degrees between a sidewall of the second CESL 114 and an upper surface of the recess 126. The angle α2 being in the range of about 10 degrees to about 45 degrees may provide a favorably large area for a metal plug to be formed. The angle α2 being smaller than about 10 degrees may lead to a worse gap-fill of the metal plug. The angle α2 being larger than about 45 degrees may produce an insufficiently small area for a metal plug, which could lead to high interface resistance.

Figure 20:
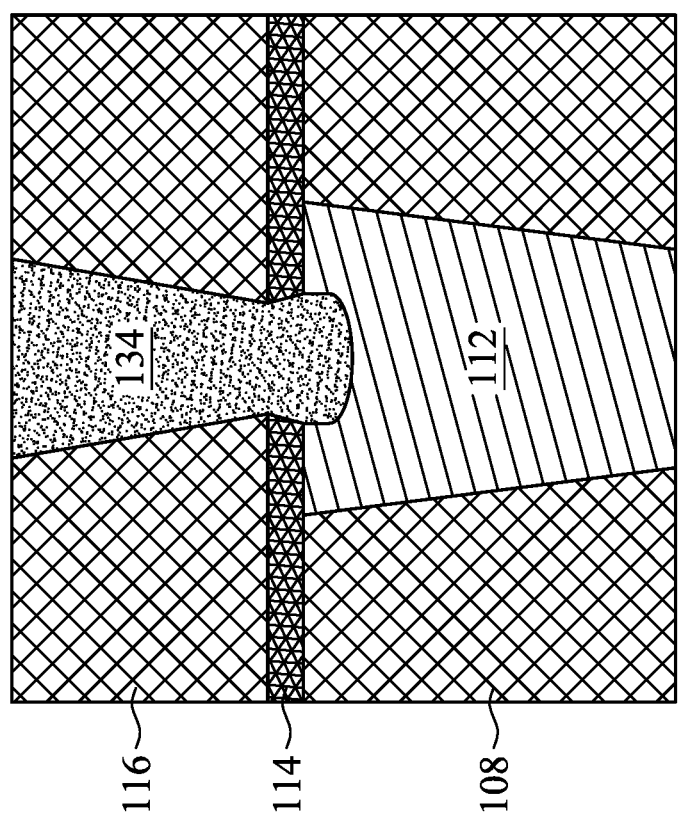

In FIG. 20, which follows from FIG. 19A, a conductive feature 134 is formed in the recess 126 and the opening 124 in connection with the source/drain contact 112. In other embodiments, the conductive feature 134 may be formed in the recess 126' and the opening 124 as following from FIG. 19B. The conductive feature 134 can be deposited in the recess 126 and opening 124 by CVD, ALD, electroless deposition (ELD), PVD, electroplating, or another deposition technique. The conductive feature 134 may be or comprise tungsten, cobalt, copper, ruthenium, aluminum, gold, silver, alloys thereof, the like, or a combination thereof. When the conductive feature 134 substantially fills the recess 126 and opening 124, the deposition process is then terminated. The excess of conductive feature 134 outgrown from the opening 124 and the recess 126 may be removed by using a planarization process such as a CMP, for example. The planarization process may remove excess conductive feature 134 from above a top surface of the third ILD 116. Hence, top surfaces of the conductive feature 134 and the third ILD 116 may be coplanar. The conductive feature 134 may be or may be referred to as a contact, plug, metal plug, conductive line, conductive pad, via, via-to-interconnect layer ($V_o$), etc. A larger contact area on the bottom surface of the conductive feature 134 may result in lower contact resistance, improving device functioning.

Figure 21:
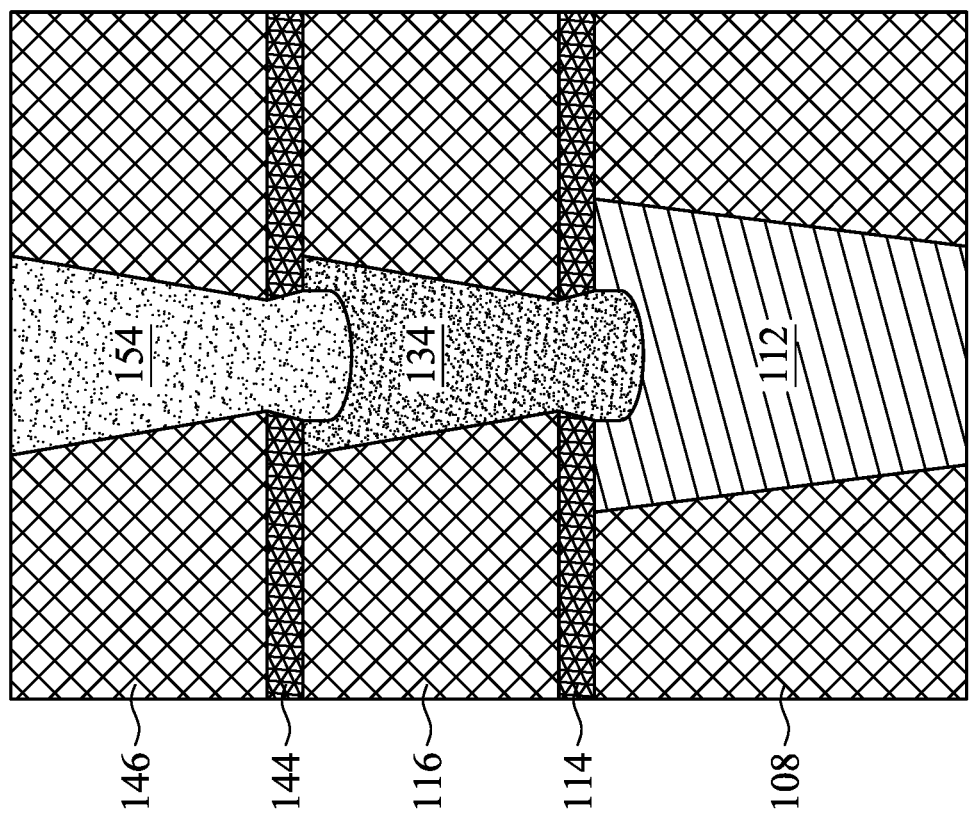

FIG. 21 illustrates another embodiment following from FIG. 20. In this embodiment, a third CESL 144 and a fourth ILD 146 are formed over the conductive feature 134 and the third ILD 116. A conductive feature 154 is formed through the fourth ILD 146 and the third CESL 144 in connection with the conductive feature 134 by a substantially similar process as described above with respect to FIGS. 18, 19A, and 20. The conductive feature 154 may be or may be referred to as a contact, plug, metal plug, conductive line, conductive pad, via, via-to-interconnect layer ($V_1$), etc. In other embodiments, the process may be repeated for additional cycles to form additional CESLs, ILDs, and conductive features over the stack illustrated in FIG. 21. In this way, additional via-to-interconnect layers $V_2$, $V_3$, etc. of substantially similar shape to the conductive features 134 and 154 may be formed over and physically connected to the conductive features 134 and 154, up to some desired $V_N$.

Figure 22:
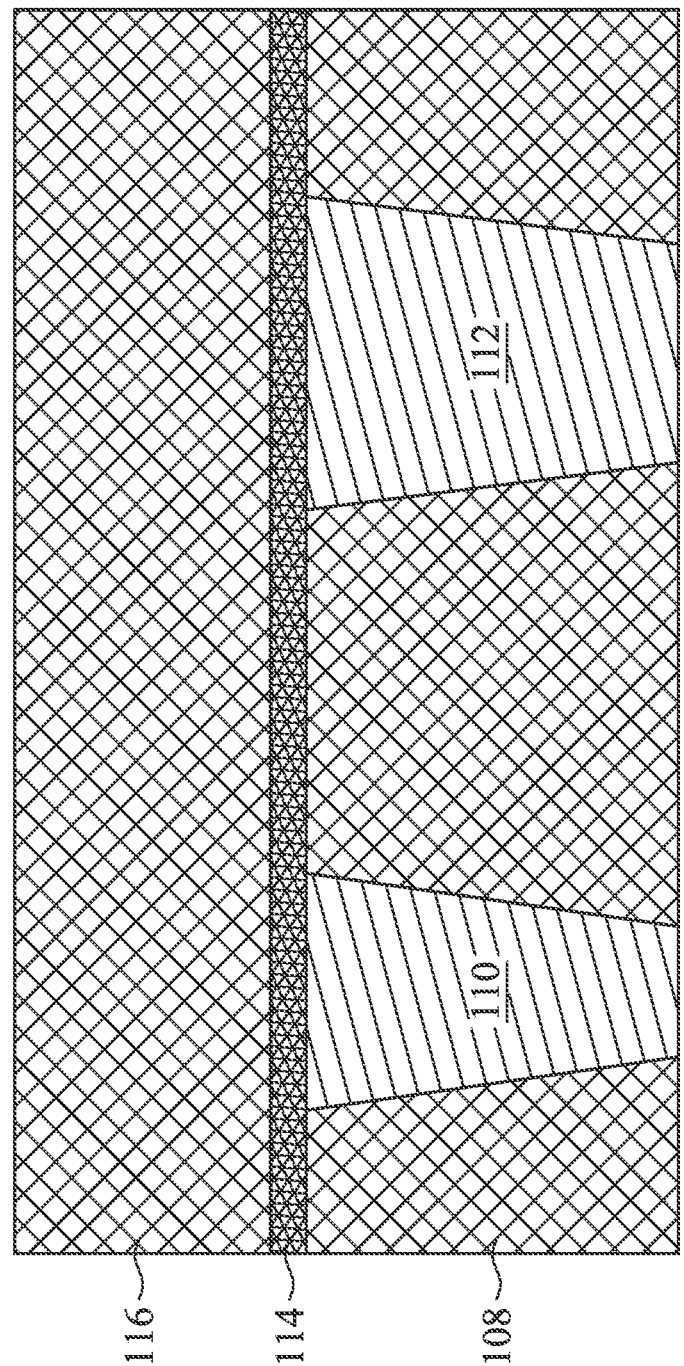
Figure 23:
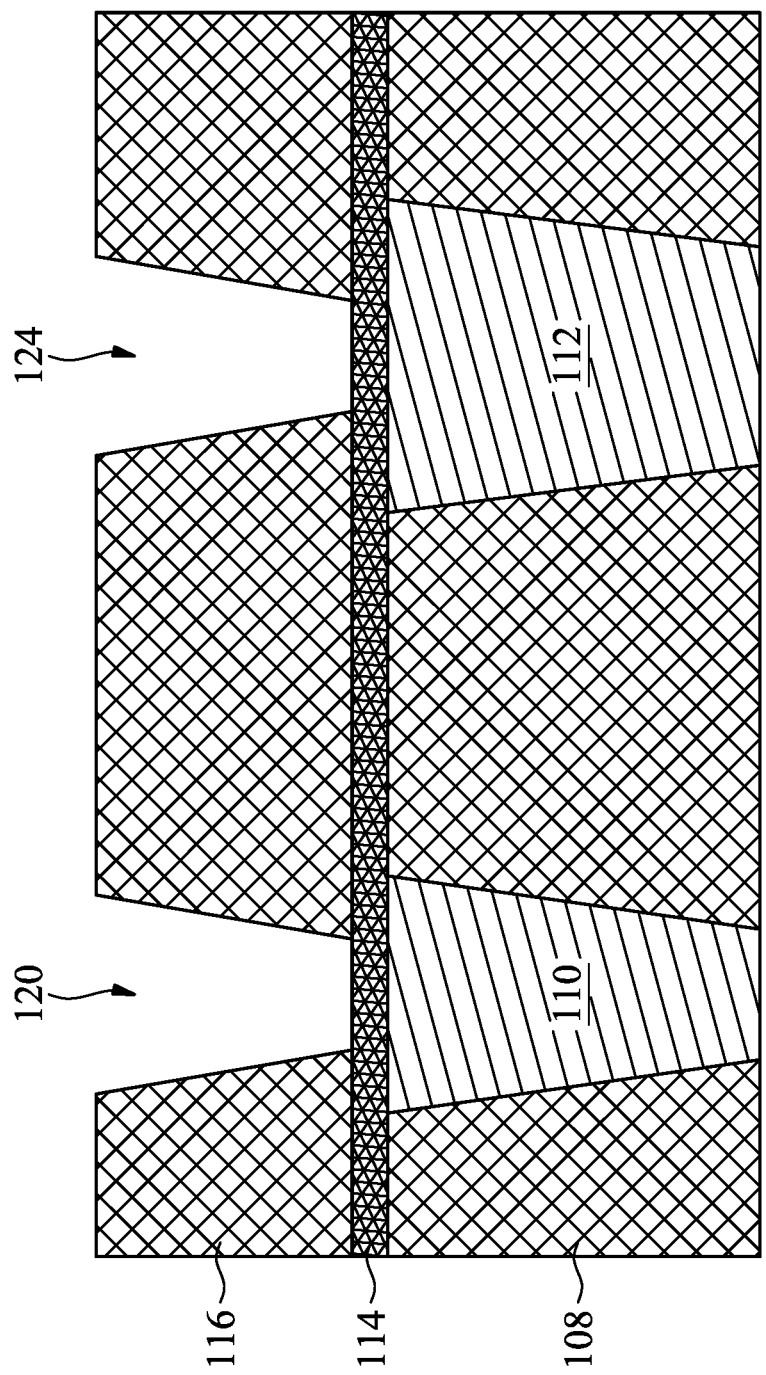
Figure 24:
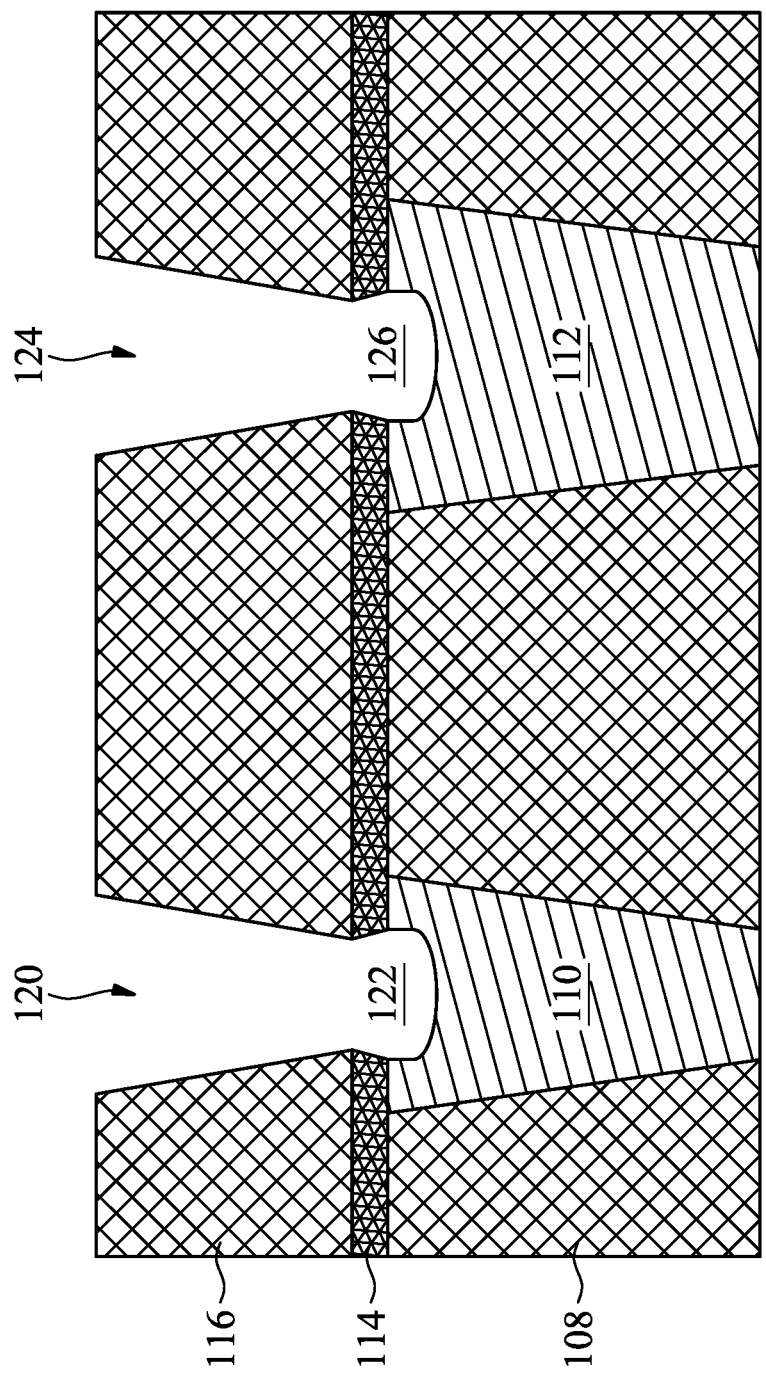
Figure 25:
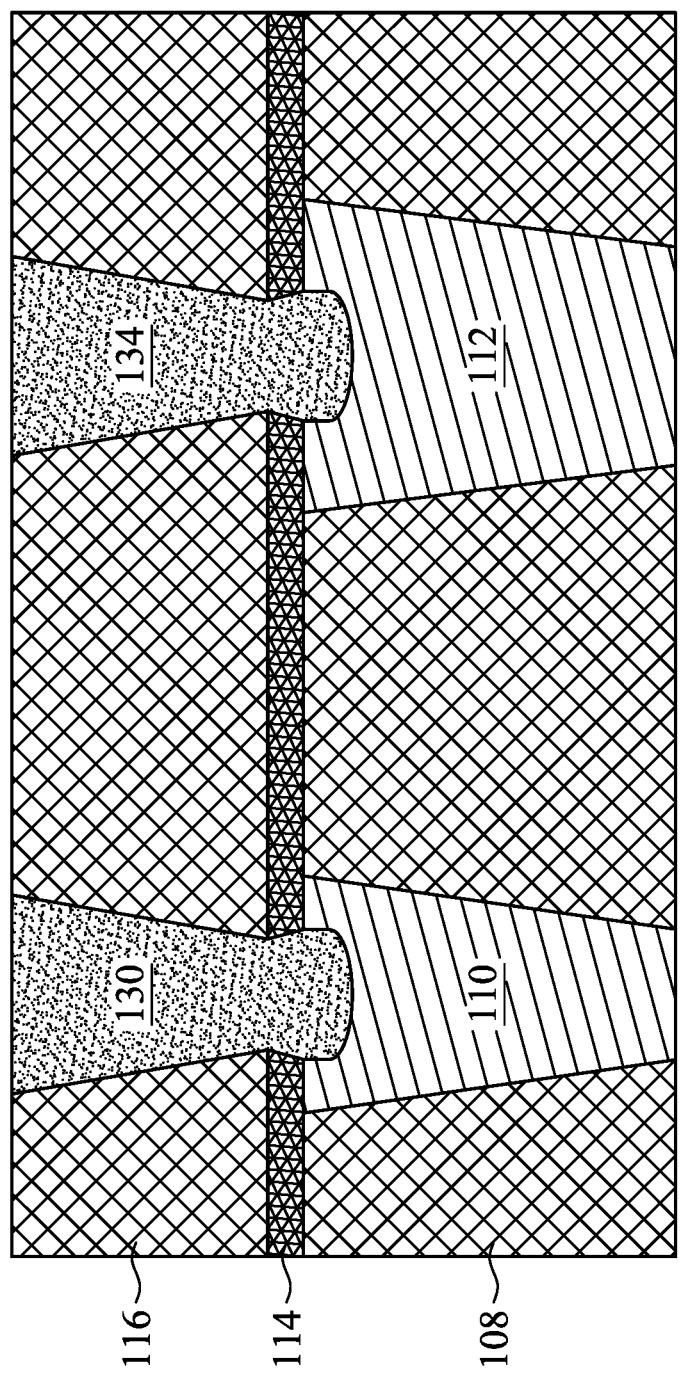

FIG. 22 illustrates a detailed view of region 119 of FIG. 17A, in accordance with another embodiment. FIG. 23 follows from FIG. 22 and illustrates an opening 120 formed through the third ILD 116 to the second CESL 114 directly above the gate contact 110 in addition to the opening 124 formed directly above the source/drain contact 112. The opening 120 may be formed by substantially similar methods as the opening 124, as disclosed above in respect to FIG. 19A. In FIG. 24, recesses 122 and 126 are formed into the second CESL 114 by substantially similar processes as described above with respect to FIG. 19A. In FIG. 25, a conductive feature 130 is formed in the recess 122 and the opening 120 in connection with the gate contact 110, in addition to the conductive feature 134 formed in the recess 126 and the opening 124 in connection with the source/drain contact 112. The conductive feature 130 may be formed by substantially similar processes as the conductive feature 134, as described above in respect to FIG. 20. The conductive feature 130 may be or may be referred to as a contact, plug, metal plug, conductive line, conductive pad, via, via-to-interconnect layer ($V_0$), etc.

Figure 26:
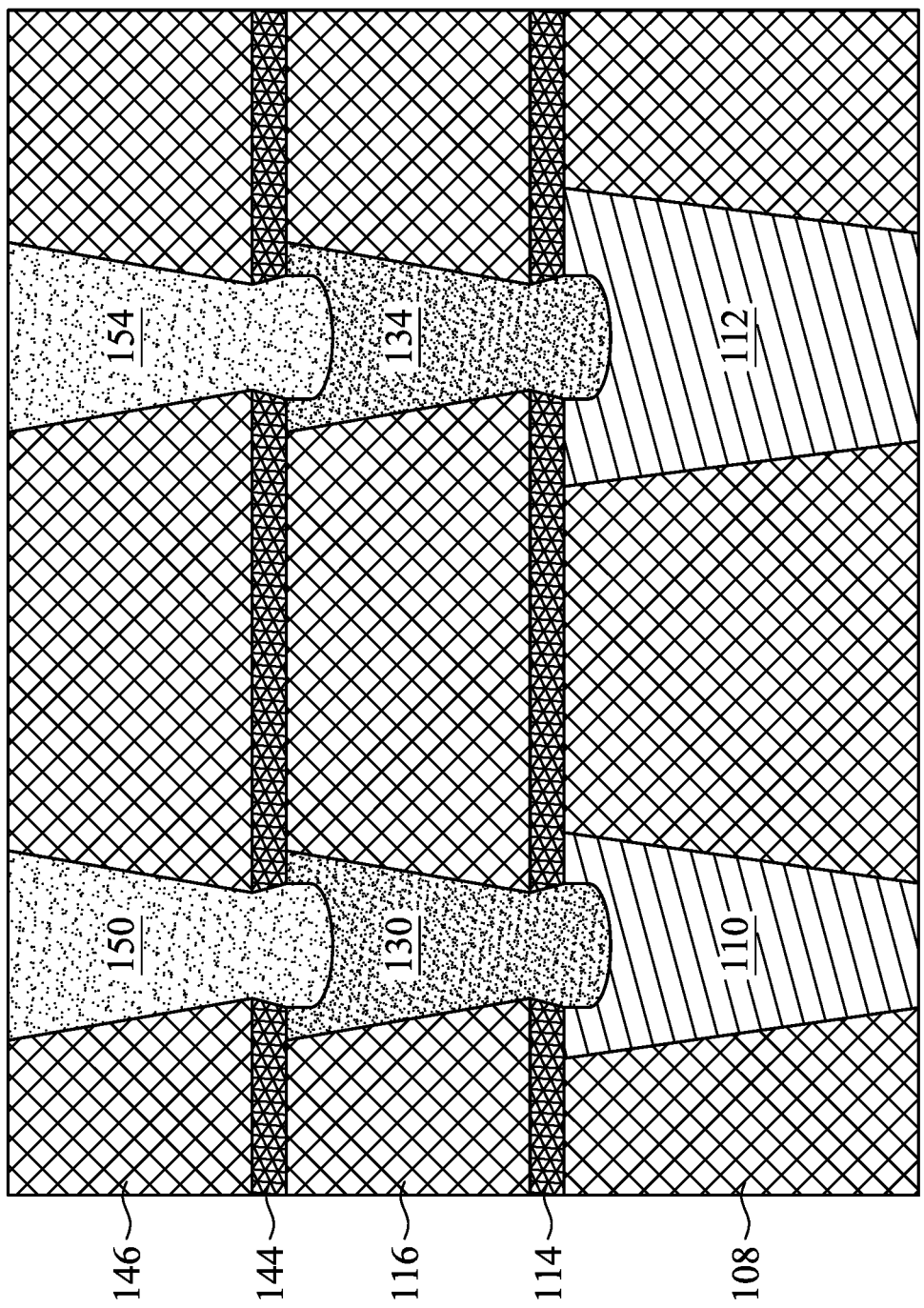

FIG. 26 illustrates another embodiment following from FIG. 25. In this embodiment, conductive features 150 and 154 are formed through the fourth ILD 146 and the third CESL 144 in connection with the conductive features 130 and 134, respectively, by a substantially similar process as described above with respect to FIGS. 18, 19A, 20, and 21. The conductive feature 150 may be or may be referred to as a contact, plug, metal plug, conductive line, conductive pad, via, via-to-interconnect layer ($V_1$), etc. In other embodiments, the process may be repeated for additional cycles to form additional CESLs, ILDs, and conductive features over the stack illustrated in FIG. 26. In this way, additional via-to-interconnect layers $V_2$, $V_3$, etc. of substantially similar shape to the conductive features 130, 134, 150, and 154 may be formed over and physically connected to the conductive features 130, 134, 150, and 154, up to some desired $V_N$.

The embodiments described above may achieve advantages. The wet etch process used for wet breakthrough of a CESL layer may produce distinctive profiles for metal plugs and allow for tuning of CESL critical dimensions without impacting ILD material dimensions. Metal plugs formed with larger contact areas may achieve lower contact resistance, improving device function. Short circuiting of metal gates to source/drain regions may be prevented by lateral control over CESL etching. Embodiments can be applied to metal plug formation in semiconductor middle end of the line (MEoL) and back end of the line (BEoL) processes, including but not limited to processes for forming conductive vias or for performing post-via etch cleaning.

In accordance with an embodiment, a method for forming a semiconductor device includes forming a metal contact over a substrate, forming a first etch stop layer (ESL) on the metal contact, forming a first dielectric on the first ESL, forming a first opening in the first dielectric, performing a wet etch on a bottom surface of the first opening through the first ESL such that the wet etch forms a first recess in a top surface of the metal contact, such that the first recess has an upper width measured on a plane level with a top surface of the first ESL, such that the first recess has a lower width measured on a plane level with a bottom surface of the first ESL, and such that the upper width is smaller than the lower width, and forming a first conductive feature in the first recess and the first opening. In an embodiment, the first recess has a depth in a range of less than about 10 nm. In an embodiment, the first recess has sidewalls with a height of less than about 10 nm. In an embodiment, the first recess has a concave bottom surface. In an embodiment, the bottom surface of the first recess contacts a bottom surface of the first ESL. In an embodiment, the performing wet etch through the first ESL forms an angle in a range of about 0 degrees to about 45 degrees between a surface level with a bottom surface of the first ESL and an upper surface of the first recess. In an embodiment, the method further includes forming a second ESL and a second dielectric over the first dielectric and the first conductive feature, forming a second opening through the second dielectric directly over the first conductive feature, and performing a wet etch through the second ESL over the first conductive feature, such that the wet etch forms a second recess in a top surface of the first conductive feature. In an embodiment, the method further includes forming a second conductive feature in the second recess and the second opening.

In accordance with another embodiment, a method for forming a semiconductor device includes forming a contact etch stop layer (CESL) over a first conductive feature, forming an interlayer dielectric (ILD) over the CESL, forming an opening through the ILD to a top surface of the CESL, performing a wet breakthrough on the CESL such that the wet breakthrough includes a wet etch process, such that the wet breakthrough forms a recess in a top surface of the first conductive feature, and such that the recess comprises an angle in a range of about 0 degrees to about 45 degrees between a surface level with a bottom surface of the CESL and an upper surface of the recess, depositing a conductive material in the recess and the opening, and planarizing a portion of the conductive material above the opening, the remaining portion of the conductive material forming a second conductive feature. In an embodiment, the wet etch process includes deionized (DI) water, $CO_2$ blended DI water, $O_3$ blended DI water, $H_2O_2$ blended DI water, $NH_4OH$ solution, or APM. In an embodiment, the $H_2O_2$ blended DI water has a concentration of $H_2O_2$ to DI water in a range of about 1:5 to about 1:30. In an embodiment, the $NH_4OH$ solution has a concentration of $NH_4OH$ to DI water in a range of about 1:5 to about 1:2000. In an embodiment, the APM has concentrations of $NH_3$, $H_2O_2$, and DI water in a range of about 1:1:5 and about 1:1:400. In an embodiment, the wet etch process is performed for a time interval in a range of about 30 seconds and about 300 seconds. In an embodiment, the wet etch process is performed at a temperature in a range of room temperature to about 65° C.

In accordance with yet another embodiment, a semiconductor structure includes a metal contact over a substrate, a first etch stop layer (ESL) over the metal contact, and a metal plug. The metal plug includes a first portion below a top surface of the metal contact such that a bottom surface of the first portion is convex, a second portion disposed between a first surface level with a top surface of the first ESL and a second surface level with a bottom surface of the first ESL, a sidewall of the second portion forming an angle in a range of about 10 degrees to about 45 degrees with the second surface, and a third portion disposed above the first surface. In an embodiment, the first portion has a height in a range of less than about 10 nm. In an embodiment, the first portion has a width measured at the second surface in a range of less than about 10 nm. In an embodiment, the first ESL has a thickness in a range of about 1 nm to about 5 nm. In an embodiment, a boundary between the bottom surface of the first ESL and the top surface of the metal contact may have a width less than about 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
   forming a metal contact over a substrate;
   forming a first etch stop layer (ESL) on the metal contact;
   forming a first dielectric over the first ESL;
   forming a first opening in the first dielectric;
   performing a wet etch on a bottom surface of the first opening and through the first etch stop layer (ESL), wherein the wet etch forms a first recess through the first ESL and in a top surface of the metal contact, wherein the first recess comprises an angle in a range of about 10 degrees to about 45 degrees between a surface level with a bottom surface of the first ESL and a sidewall of the first ESL, wherein the first recess has an upper width measured on a plane level with a top surface of the first ESL, wherein the first recess has a lower width measured on a plane level with a bottom surface of the first ESL, and wherein the upper width is smaller than the lower width; and
   forming a first conductive feature in the first recess and the first opening.

2. The method of claim 1, wherein the first recess has a depth in a range of less than about 10 nm.

3. The method of claim 1, wherein the first recess has sidewalls with a height of less than about 10 nm.

4. The method of claim 1, wherein the first recess has a concave bottom surface.

5. The method of claim 4, wherein the bottom surface of the first recess contacts a bottom surface of the first ESL.

6. The method of claim 1 further comprising:
   forming a second ESL and a second dielectric over the first dielectric and the first conductive feature;
   forming a second opening through the second dielectric directly over the first conductive feature; and
   performing a wet etch through the second ESL over the first conductive feature, wherein the wet etch forms a second recess in a top surface of the first conductive feature.

7. The method of claim 6 further comprising forming a second conductive feature in the second recess and the second opening.

8. The method of claim 1, wherein the first ESL has a thickness in a range of 1 nm to 5 nm.

9. A method for forming a semiconductor device, comprising:
   forming a contact etch stop layer (CESL) over a first conductive feature;
   forming an interlayer dielectric (ILD) over the CESL;
   forming an opening through the ILD to a top surface of the CESL;
   performing a wet breakthrough on the CESL, wherein the wet breakthrough comprises a wet etch process, wherein the wet breakthrough forms a recess in a top surface of the first conductive feature, wherein the recess comprises an angle in a range of about 10 degrees to about 45 degrees between a surface level with a bottom surface of the CESL and an upper surface of the recess;
   depositing a conductive material in the recess and the opening; and
   planarizing a portion of the conductive material above the opening, the remaining portion of the conductive material forming a second conductive feature.

10. The method of claim 9, wherein the wet etch process comprises deionized (DI) water, $CO_2$ blended DI water, $O_3$ blended DI water, $H_2O_2$ blended DI water, $NH_4OH$ solution, or APM.

11. The method of claim 10, wherein the $H_2O_2$ blended DI water has a concentration of $H_2O_2$ to DI water in a range of about 1:5 to about 1:30.

12. The method of claim 10, wherein the $NH_4OH$ solution has a concentration of $NH_4OH$ to DI water in a range of about 1:5 to about 1:2000.

13. The method of claim 10, wherein the APM has concentrations of $NH_3$, $H_2O_2$, and DI water in a range of about 1:1:5 and about 1:1:400.

14. The method of claim 9, wherein the wet etch process is performed for a time interval in a range of about 30 seconds and about 300 seconds.

15. The method of claim 9, wherein the wet etch process is performed at a temperature in a range of room temperature to about 65° C.

16. A method for forming a semiconductor device, comprising:

exposing a top surface of an etch stop layer (ESL), the ESL being on a first conductive feature;

forming a recess in a top surface of the first conductive feature, the forming the recess comprising a wet etch through the ESL, an angle measured between a sidewall of the ESL above the recess and a top surface of the ESL being acute; and forming a second conductive feature, the forming the second conductive feature comprising filling the recess with a conductive material.

17. The method of claim 16, wherein forming the second conductive feature further comprises filling an opening through the ESL with the conductive material, the opening being above the recess.

18. The method of claim 16, wherein the wet etch comprises $H_2O_2$ blended deionized water (DIW), the $H_2O_2$ blended (DIW) having a ratio of $H_2O_2$ to DIW in a range of 1:5 to 1:30.

19. The method of claim 16, wherein the wet etch comprises an $NH_4OH$ solution, the $NH_4OH$ solution having a concentration of $NH_4OH$ to deionized water in a range of 1:5 to 1:2000.

20. The method of claim 16, wherein the wet etch is performed using a solution of HCl, $H_2O_2$, and deionized water at concentrations in a range from 1:1:5 to 1:1:400.

* * * * *